(12) United States Patent
Fukushima et al.

(10) Patent No.: US 7,682,975 B2
(45) Date of Patent: Mar. 23, 2010

(54) SEMICONDUCTOR DEVICE FABRICATION METHOD

(75) Inventors: Dai Fukushima, Kanagawa (JP); Gaku Minamihaba, Kanagawa (JP); Hiroyuki Yano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/472,462

(22) Filed: Jun. 22, 2006

(65) Prior Publication Data

US 2006/0293191 A1 Dec. 28, 2006

(30) Foreign Application Priority Data

Jun. 22, 2005 (JP) .............................. 2005-181772

(51) Int. Cl.
*H01L 21/461* (2006.01)
*H01L 21/4763* (2006.01)

(52) U.S. Cl. .................... 438/691; 438/627; 438/687; 438/692

(58) Field of Classification Search ................ 438/627, 438/643, 687, 691
See application file for complete search history.

(56) References Cited

U.S. PATENT DOCUMENTS

| 5,780,204 A | 7/1998 | La et al. |
| 6,059,637 A * | 5/2000 | Pasch et al. .................... 451/41 |
| 6,136,708 A | 10/2000 | Aoki |
| 6,153,519 A | 11/2000 | Jain et al. |
| 6,730,594 B2 * | 5/2004 | Noguchi et al. ............. 438/653 |
| 2004/0253822 A1 | 12/2004 | Matsui et al. |

FOREIGN PATENT DOCUMENTS

| CN | 1171166 A | 1/1998 |
| CN | 1195188 A | 10/1998 |
| CN | 1574205 A | 2/2005 |
| JP | 2000-150640 | 5/2000 |
| JP | 2004-288870 | 10/2004 |
| KR | 2000-0025908 | 5/2000 |
| KR | 2001-0070451 | 7/2001 |
| TW | 200302865 | 8/2003 |
| WO | WO 96/15552 | 5/1996 |

OTHER PUBLICATIONS

First Office Action issued by the Chinese Patent Office on Dec. 21, 2007, for Chinese Patent Application No. 200610093142.2, and English-language translation of text of First Office Action.
Official Notice Remarks Submission issued by the Korean Patent Office on May 11, 2007, for Korean Patent Application No. 10-2006-55763, and English-language translation thereof.
An Office Action mailed Dec. 31, 2008, from the Taiwanese Patent Office in counterpart Taiwan Application No. 095120499.

* cited by examiner

*Primary Examiner*—N Drew Richards
*Assistant Examiner*—Grant S Withers
(74) *Attorney, Agent, or Firm*—Finnegan, Henderson, Farabow, Garrett & Dunner, L.L.P.

(57) ABSTRACT

A semiconductor device fabricating method includes forming a thin film at a top surface of a substrate; polishing a back surface of said substrate; and after the polishing of the back surface, polishing said thin film as formed at the top surface of said substrate.

14 Claims, 17 Drawing Sheets

|  | Judgment | Film Peeloff (in 25 pieces) | Scratch |
|---|---|---|---|
| Sample #1 | × | 2 | 35 |
| Sample #2 | × | 1 | 24 |
| Sample #3 | × | 3 | 42 |
| Sample #4 | × | 2 | 32 |
| Sample #5 | △ | 0 | 8 |
| Sample #6 | △ | 0 | 9 |
| Sample #7 | △ | 0 | 4 |
| Sample #8 | ○ | 0 | 1 |
| Sample #9 | ○ | 0 | 2 |
| Sample #10 | ○ | 0 | 1 |
| Sample #11 | ◎ | 0 | 0 |

|  | Judgment | Chuck Error Freq. (in 50 pieces) | Yield (%) |
|---|---|---|---|
| Sample #1 | × | 7 | 80 |
| Sample #2 | × | 6 | 85 |
| Sample #3 | × | 7 | 70 |
| Sample #4 | × | 8 | 82 |
| Sample #5 | ○ | 0 | 98 |
| Sample #6 | ○ | 0 | 100 |
| Sample #7 | ○ | 0 | 100 |
| Sample #8 | ○ | 0 | 99 |
| Sample #9 | ○ | 0 | 100 |
| Sample #10 | ○ | 0 | 99 |
| Sample #11 | ○ | 0 | 100 |

Usable ↓

FIG. 13

SEMICONDUCTOR DEVICE FABRICATION METHOD

CROSS-REFERENCE TO RELATED APPLICATION

This application is based upon and claims the benefit of priority to Japanese Patent Application No. 2005-181772, filed on Jun. 22, 2005, the entire contents of which are incorporated herein by reference.

BACKGROUND OF THE INVENTION

1. Field of the Invention

The present invention relates generally to methodology of making semiconductor devices and, more particularly, to a semiconductor device fabrication method which requires a thin-film polishing process or processes.

2. Related Art

In recent years, advanced microfabrication technologies are newly developed to meet the need for increased integration densities and higher performances of ultralarge-scale integrated (ULSI) semiconductor circuit devices. In particular, in order to achieve high speed performances for LSI chips, attempts are recently made to replace electrical wiring material from traditionally used aluminum (Al) alloys to copper (Cu) with low resistivity or Cu alloys (collectively referred to as "Cu" hereinafter). In view of the fact that Cu is difficult in microfabrication by means of dry etch techniques, which have frequently been used in the formation of Al alloy wires, the so-called damascene method is used in most cases to form buried or "embedded" on-chip lead wires by depositing a Cu film on an insulative film with trench-like grooves defined therein and then removing by chemical-mechanical polish (CMP) techniques its selected portions other than groove-buried film portions. Typically the Cu film is such that after having formed a thin seed layer by sputter methods, electrolytic plating is applied thereto to form a multilayered film having a thickness of several hundred of nm. In the case of forming a multilayered Cu wire pattern, an alternative method is employable for forming wires of the type having the so-called "dual damascene" structure. This method has the steps of depositing an insulative or dielectric film on its underlying wires, defining therein certain openings called "via holes" and trenches (wiring grooves) for upper-layer wire use, burying a film of chosen wiring material, such as Cu, both in the via holes and in the trenches at a time, and removing unnecessary overlying Cu portions by CMP to thereby planarize the film surface, resulting in formation of the intended buried wires.

Recently, consideration is given to using as an interlayer dielectric (ILD) film a film of specific insulative material which is low in dielectric constant, known as the low dielectric constant k or "low-k" film. More specifically, attempts are made to reduce the parasitic capacitance between wires by use of a low-k film having its relative dielectric constant k of 3.5 or below, which is lower than the relative dielectric constant, e.g., about 4.2, of silicon oxide films ($SiO_2$ films).

Unfortunately the low-k film has in many cases a porous structure in order to achieve such extra-low dielectricity, resulting in a decrease in physical or mechanical strength. Accordingly, during chemical-mechanical polishing (CMP) of a Cu film, particles attached to the bottom or back surface of a semiconductor substrate can be detached or "liberated" to move onto the substrate's top surface. If this is the case, the particles act as start points of occurrence of Cu-film peeling and/or scratching defects. Once such defects take place, it is no longer possible to form electrical interconnect wires of high quality.

In currently available semiconductor device fabrication processes, CMP is applied to a semiconductor substrate at various stages other than the Cu wire forming step, which include, but not limited to, forming a shallow trench isolation (STI) structure, forming an insulative film on or above resultant device, and defining interlevel connection studs or "plugs" in the insulator film. When performing these CMP processes, if contaminant particles are attached to the back surface of a substrate, then the film peel-off and scratching can occur at the film thus processed in the way stated above.

As ultralarge-scale integration (ULSI) chips increase in integration and in performance, the minimum feature size of on-chip wires is decreased to a level of 90 nanometers (nm) or less. This wire width shrinkage makes it more difficult to well control the size dimensions thereof. Similarly, in the formation of onchip circuit elements which underlie the wires also, the size control appreciably increases in difficulty. The accuracy of such wire size is much influenceable by the precision of exposure size in lithography processes. Thus, in order to obtain the intended focal depth large enough to accomplish successful exposure, a need is felt to exhaustively remove any residual contaminant particles on a semiconductor substrate-supporting stage or "table" of exposure equipment. However, particles are still attachable to the back surface of a semiconductor substrate. Due to the presence of such particles, chuck errors can occur in the event that the substrate is chucked. This makes it impossible to perform chucking on the stage. In the worst case, any intended exposure is hardly executable.

Prior known approaches to avoiding the problem occurring due to residual contaminants attached to the back surface of a semiconductor substrate include a technique (as disclosed for example in JP-A-2000-150640) for removing metallic contaminants residing on the back surface of a semiconductor substrate during fabrication of a multilayer wiring pattern, which has the steps of forming a barrier film on the substrate back surface and, after having formed the multilayer wires, selectively removing the barrier film by CMP to thereby prevent such metal contaminants from diffusing thereafter into the substrate. Another technique is found in JP-A-2004-288870, which is for cleaning and removing by chemical solutions the barrier film together with the metal contaminants after having formed multilayer wires to thereby preventing subsequent outdiffusion of the metal contaminants into the substrate.

However, these techniques fail to provide a remedy for successful removal of those residual particles as attached to the back surface of a semiconductor substrate during CMP-based processes, for example, at the time the multilayered wires are formed and, for this reason, are incapable of bringing solutions to the problem as to the occurrence of film peel-off and scratch defects.

BRIEF SUMMARY OF THE INVENTION

In accordance with one aspect of this invention, a method of fabricating a semiconductor device is provided, which includes forming a thin film at a top surface of a substrate; polishing a back surface of said substrate; and after the polishing of the back surface, polishing said thin film as formed at the top surface of said substrate.

In accordance with another aspect of this invention, a method for fabricating a semiconductor device is provided, which includes forming a diffusion prevention film on or above a back surface of a substrate; forming at a top surface of said substrate a conductive material film using a conductive material with its diffusion being prevented by said diffusion prevention film; after formation of said conductive material film, polishing the diffusion prevention film formed at the back surface of said substrate by using a polishing liquid containing therein any one of resin particles and colloidal silica; and after having polished said diffusion prevention film, polishing said conductive material film as formed at the top surface of said substrate.

BRIEF DESCRIPTION OF FIGURES OF THE DRAWING

FIG. 13 is a table showing evaluation result of the samples as to the chuck error frequency and lead wire yield.

DETAILED DESCRIPTION OF THE INVENTION

Embodiment 1

A semiconductor device fabrication process in accordance with an embodiment 1 will be described below, which includes a step which forms electrical interconnect wires made of a conductive material, e.g., copper (Cu).

The embodiment 1 will be explained with reference to some of the accompanying drawings below.

Figure 1:
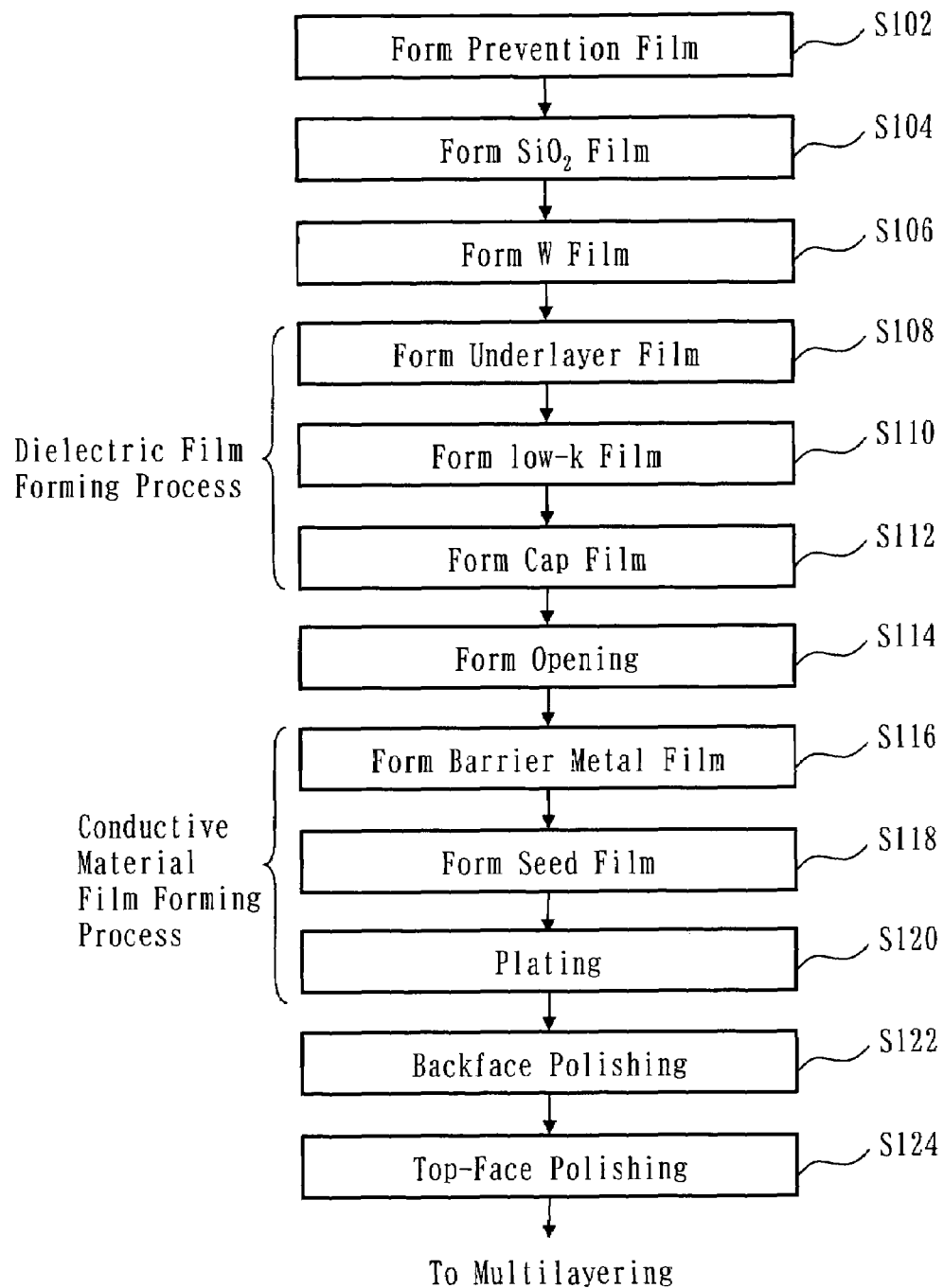
FIG. 1 is a flow chart showing major process steps of a semiconductor device fabrication method in accordance with an embodiment 1 of the invention.

FIG. 1 is a flow chart showing main process steps of the semiconductor device fabrication method in the embodiment 1.

As shown herein, this embodiment performs a series of processes including a diffusion prevention film forming step S102 which forms a thin-film of diffusion prevention film, an $SiO_2$ film forming step S104 which forms a thin-film of $SiO_2$, a tungsten film forming step S106 which forms a thinfilm of tungsten (W), an under-layer film forming step S108 which forms a thinfilm of underlayer, a "low-k" film forming step S110 which forms a thin-film of low dielectric constant k, i.e., low-k, film that is made of insulative material of low dielectric constant, a cap film forming step S112 which forms a thin-film of a cap film, an opening forming step S114 for forming openings such as via holes, a barrier metal film forming step S116 which forms a conductive material film for use as a barrier metal film, a seed film forming step S118, a metal plating step S120, a back surface polishing step S122, and a top surface polishing step S124.

FIGS. 2A to 2D are diagrams illustrating, in cross-section, some process steps to be carried out in a way corresponding the flowchart of FIG. 1—more specifically, from the diffusion prevention film forming step S102 up to the underlayer film forming step S108 in FIG. 1. The following steps will be set forth later.

Figure 2A:
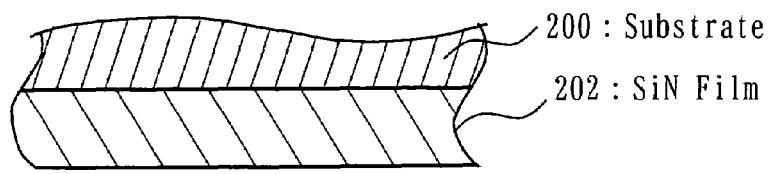
FIGS. 2A through 2D are diagrams depicting, in cross-section, some steps to be carried out in a way corresponding to the flow chart of FIG. 1.

As shown in FIG. 2A, at the diffusion prevention film forming step S102 of FIG. 1, silicon nitride (SiN) is deposited on entire surfaces of a semiconductor substrate 200, including a top surface and a bottom or back surface thereof, to a thickness of about 60 nanometers (nm), thereby forming a thin-film of SiN film 202 as a diffusion prevention film of Cu. The SiN film 202 is typically formed by low pressure chemical vapor deposition (LP-CVD) techniques. Although the film formation is done by LP-CVD here, other appropriate techniques are alternatively employable. In FIG. 2A, those parts other than the back surface side of substrate 200 are omitted from the illustration. In the case of forming damascene-structured electrical interconnect wires which mainly contain Cu, the back surface of substrate 200 is covered or "coated" with the diffusion prevention film to prevent Cu ions from diffusing out of the back surface of substrate 200, thereby to avoid or at least greatly suppress unwanted diffusion of Cu ions that are produced during semiconductor device fabrication into the semiconductor substrate 200, which can badly affect operations of circuit elements on the substrate surface. More desirably, the Cu diffusion prevention film is entirely formed on both the top surface and the back surface of semiconductor substrate 200. Forming the Cu diffusion prevention film on the both surfaces of substrate 200 makes it possible to prevent diffusion of Cu ions from bevel portions, which are outer peripheral portions with no on-chip circuit elements formed therein. The Cu diffusion prevention film may be made of material other than SiN, such as silicon carbide (SiC), silicon oxide carbide (SiOC) or equivalents thereto. From a view point of the prevention of Cu ion diffusion, it is desirable to leave the Cu diffusion prevention film as a surface protection film without removing the Cu diffusion prevention film until the fabrication process proceeds to a chip-packaging step including dicing, since the removal of it results in exposure of the surfaces of substrate 200. The film thickness is preferably set to range from 30 to 300 nm; more preferably, 50 nm or greater. Additionally the substrate 200 may be a silicon wafer with its diameter of 300 mm, or more or less.

Then, remove those portions of the SiN film 202 formed on the surface of substrate 200 which are in selected areas in which various types of semiconductor integrated circuit elements or "device portions" are to be later formed, although specific illustration is omitted herein. Then, form device portions in such film-removed areas.

Figure 2B:
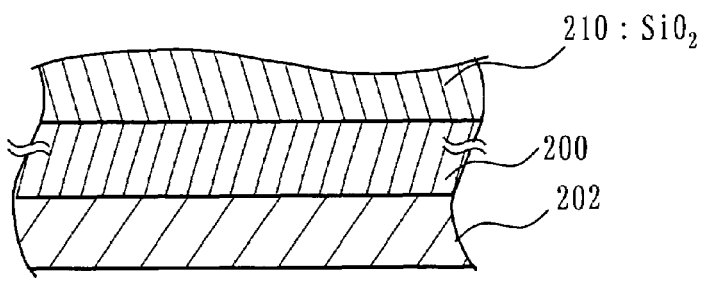

As shown in FIG. 2B, at the $SiO_2$ film forming step S104 of FIG. 1, a thin-film of $SiO_2$ film 210 with a thickness of about 500 nm for use as a dielectric film is deposited by chemical vapor deposition (CVD) on the circuit element-formed surface of substrate 200. Although the CVD method is used here for the film formation, other similar methods are employable when the need arises.

Figure 2C:
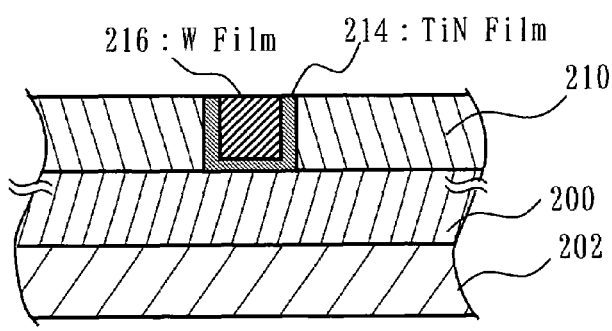

As shown in FIG. 2C, at the W film forming process step S106, holes for use as openings reaching the device portions are selectively defined in the $SiO_2$ film 210. Then, deposit on sidewalls and bottom faces of such holes a barrier metal film, for example, a thin-film of titanium nitride (TiN) film 214. Thereafter, a thinfilm of tungsten (W) film 216 is formed to fill and bury the holes, resulting in formation of buried electrical plugs. For example, the openings are defined by etching. The TiN film 214 and W film 216 may be formed by CVD techniques, followed by CMP for selective removal of their certain deposited portions other than the openings.

Figure 2D:
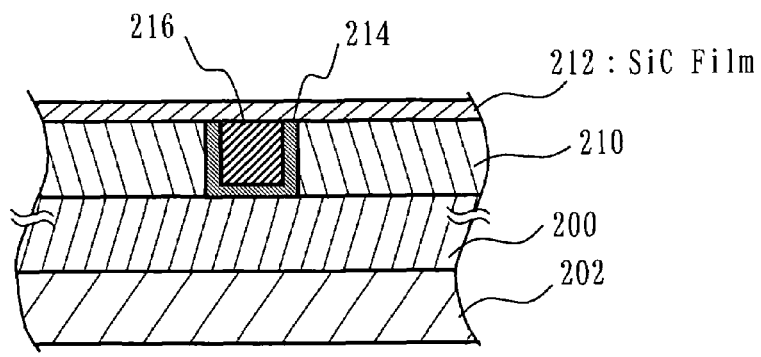

As shown in FIG. 2D, at the underlayer film forming step S108, a thin-film of SiC film with a thickness of about 50 nm is deposited by CVD on the surfaces of the plug-formed $SiO_2$ film 210 and TiN film 214 and W film 216, thereby to form an SiC film 212 for later use as the underlayer dielectric film. Although the film is formed by CVD, other methods are employable where necessary.

Figure 3A:
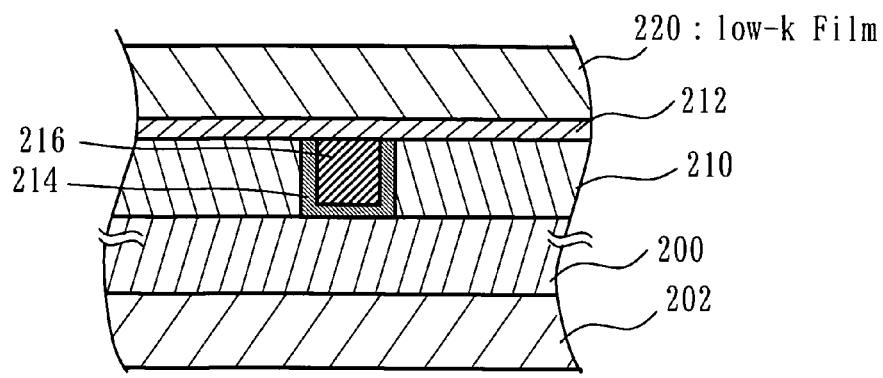
FIGS. 3A to 3C illustrate in cross-section some steps to be implemented in a way corresponding to the flowchart of FIG. 1.
Figure 3B:
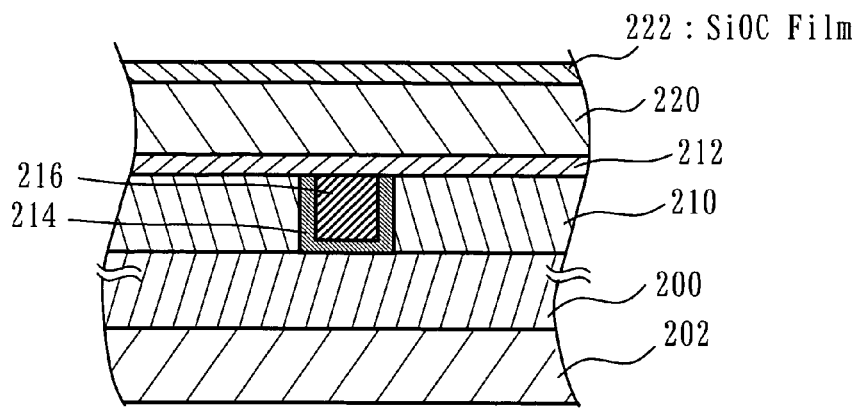
Figure 3C:
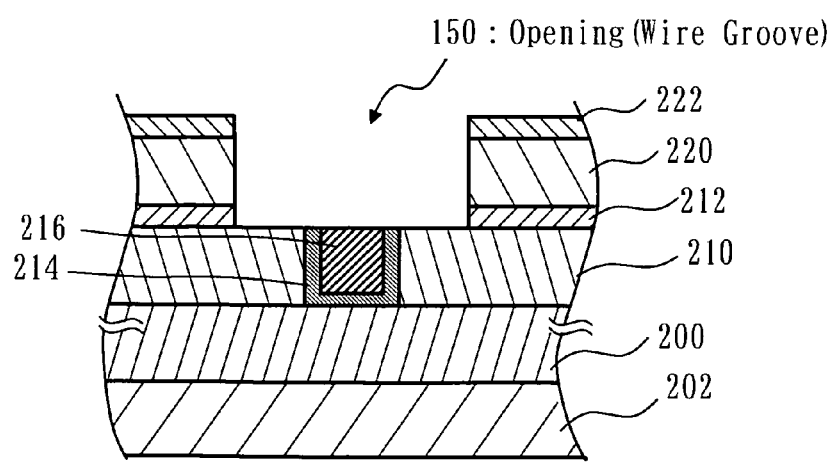

FIGS. 3A to 3C illustrate, in cross-section, some process steps to be performed in a way corresponding to the flowchart of FIG. 1, i.e., from the low-k film forming step S110 to the opening forming step S114 of FIG. 1. The steps subsequent thereto will be described later.

As shown in FIG. 3A, at the low-k film forming step S110, a thin-film of low-k film 220 made of low dielectric constant porous dielectric material is formed on the SiC film 212 above the substrate 200 to a thickness of about 200 nm. Forming such low-k film 220 makes it possible to obtain an interlayer dielectric (ILD) film having its relative dielectric constant k that is less than 3.5. Here, as an example, the low-k film 220 is formed by use of a low-k dielectric (LKD) material that is commercially available from JSR Corporation, which material comprises polymethylsiloxane with its relative dielectric constant of less than 2.5. Other examples of the material of low-k film 220 in addition to polymethylsiloxane include, but not limited to, a film having the siloxane backbone such as polysiloxane, hydrogen silses-quioxane and methylsilsesquioxane, a film containing as its main component an organic resin such as polyarylene ether, polybenzoxazole or polybenzocyclobutene, and a porous film such as a porous silica film. Using any one of these LKD materials makes it possible for the low-k film 220 to have the relative dielectric constant of 2.5 or below. An exemplary approach to forming such film is to use the so-called spin-on-dielectric (SOD) coating method which forms a thin film through spin coating of liquid solution and thermal processing applied thereto. For instance, the film fabrication is achievable in a way such that a wafer with a film being formed thereon by a spinner is baked on a hot plate in a nitrogen-containing atmosphere and is finally subjected to curing on the hot plate at a temperature higher than the baking temperature. By appropriately choosing the low-k material and properly adjusting film forming process conditions, it is possible to obtain the aimed porous dielectric film having a prespecified physicality value(s).

As shown in FIG. 3B, at the cap film forming step S112, an insulative cap film 222 made of SiOC is chemically vapor-deposited on the low-k film 220 to a thickness of about 50 nm, for example. Forming this SiOC film 222 makes it possible to protect the low-k film 220 that is inherently difficult in direct execution of lithography, which in turn enables formation of a pattern in the low-k film 220. Examples of the insulative cap film material other than SiOC are dielectric materials with dielectric constants of 2.5 or greater, such as tetra-ethoxysilane (TEOS), SiC, silicon carbohydride (SiCH), silicon carbonitride (SiCN), SiOCH, and silane ($SiH_4$). Although the film fabrication is done here by CVD, other methods are usable if necessary.

In FIG. 3C, at the opening forming step S114, more than one opening 150 that is a wiring groove structure for fabrication of the damascene wires is defined using lithography and dry etch techniques in the SiOC film 222, low-k film 220 and its underlying SiC film 212. For the substrate 200 with a resist film formed on the SiOC film 222 through resist deposition and lithography processes such as exposure (not shown), the exposed SiOC film 222 and its underlying low-k film 220 are selectively removed away by anisotropic etch techniques with the underlayer SiOC film 212 being an etch stopper therefor. Thereafter, etch the SiOC film 212 to define the opening 150. Use of the anisotropic etching makes it possible to define the opening 150 so that it has almost vertical inner walls relative to the surface of substrate 200. An example of such anisotropic etching for formation of the opening 150 is a reactive ion etching (RIE) technique.

Figure 4A:
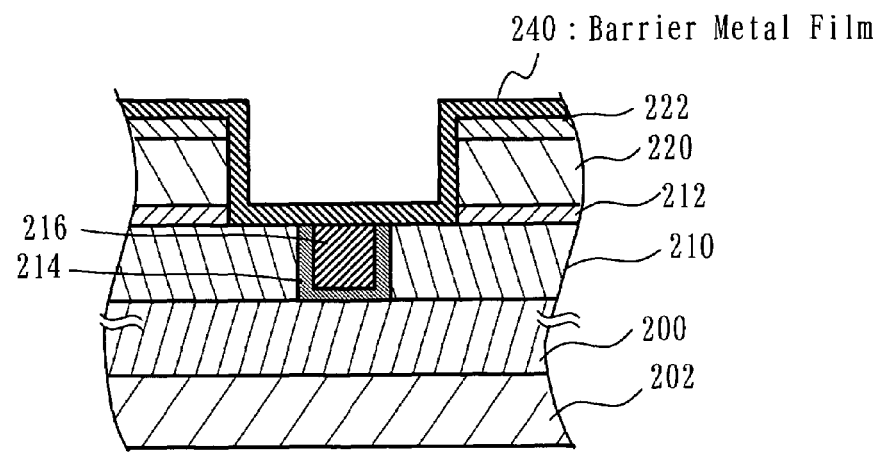
FIGS. 4A-4C and 5A-5B are process cross-section diagrams showing some other steps to be performed in a way pursuant to the flowchart of FIG. 1.
Figure 4B:
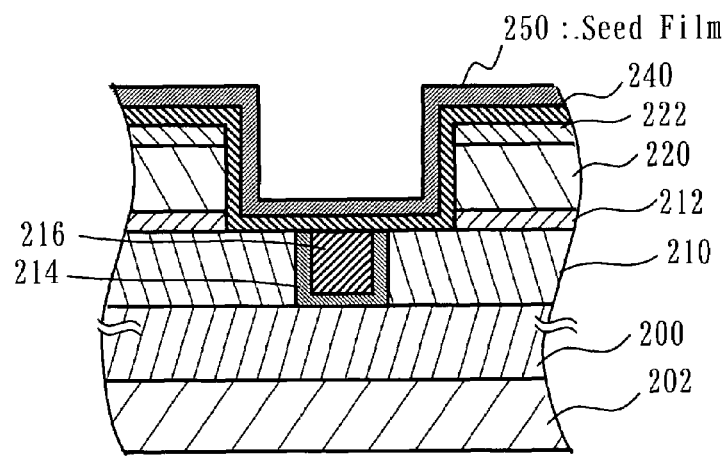
Figure 4C:
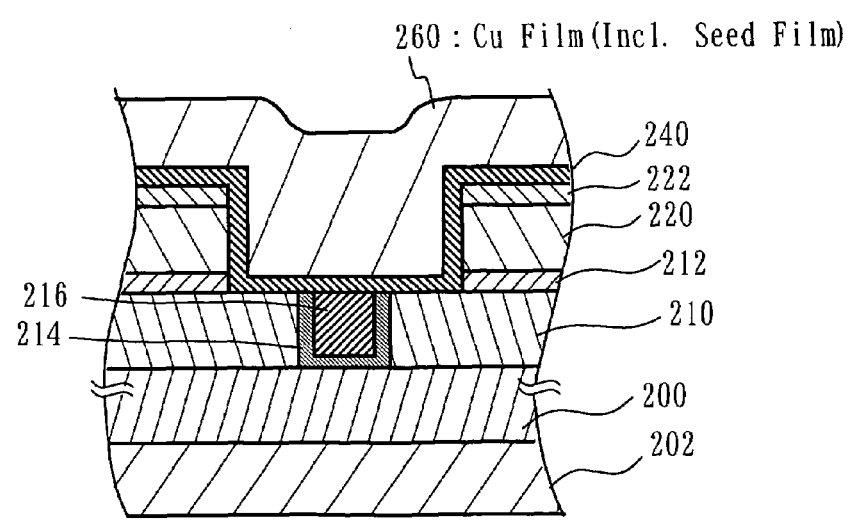

FIGS. 4A to 4C depict, in cross-section, some major process steps to be executed in a way corresponding to the flowchart of FIG. 1—namely, from the barrier metal film forming step S116 to metal plating step S120 of FIG. 1.

As shown in FIG. 4A, at the barrier metal film forming step S116, a barrier metal film 240 which is made of a chosen conductive material is formed in the opening 150 and also on a surface of the SiOC film 222. In a sputtering apparatus using a sputter technique which is one of physical vapor deposition (PVD) methods, a thin film of tantalum (Ta) is deposited to a thickness of about 5 nm, thereby forming the barrier metal film 240. The deposition of such barrier metal material is achievable not only by PVD but also by CVD methods, such as for example atomic layer deposition (ALD) or atomic layer chemical vapor deposition (ALCVD). In the latter case, it is possible to improve the coverage ratio than in the case of PVD methods. Additionally the material of barrier metal film 240 is not exclusively limited to Ta. This film may alternatively be made of tantalum nitride (TaN), titanium (Ti), tungsten (W), titanium nitride (TiN) or tungsten nitride (WN) or may be a multilayer film made of more than two of these materials in combination, such as Ta and TaN or else.

As shown in FIG. 4B, at the seed film forming step S118, a Cu thin-film is deposited by PVD, such as sputtering or else, on the inner wall of the opening 150 with the barrier metal film 240 formed thereon and also on the top surface of substrate 200. This thin film will become a cathode electrode for use in the next-executed electrolytic plating process. Here, the seed film 250 is formed to a thickness of 50 nm, for example.

In FIG. 4C, at the plating step S120, an electrochemical growth method such as electrolytic plating or else is used to deposit, with the seed film 250 being as the cathode pole, a thin film 260 of chosen conductive material, e.g., Cu, in the opening 150 and on the top surface of substrate 200. Here, the Cu film 260 is deposited to a thickness of about 800 nm. Thereafter, perform annealing at a temperature of 250° C. for 30 minutes, for example.

Although only one opening 150 for use as a wiring groove is depicted in FIGS. 3A-3C and 4A-4C and other drawings to be presented later, several wiring grooves for a narrow wire of 60-nm wide and a broad wire of 75-µm wide are formed in the embodiment 1 for evaluation purposes. The narrow wire thus formed is set to less than or equal to 50 percent (%) in coverage ratio. In other words, an isolated or "island" wire with its coverage of 50% or less was formed. The broad wire is set to 95% or less in coverage, resulting in formation of an island wire whose coverage is up to 95%. A plurality of wafers each having the Cu film 260 deposited through the above-stated process steps were prepared for comparison purposes.

Figure 5A:
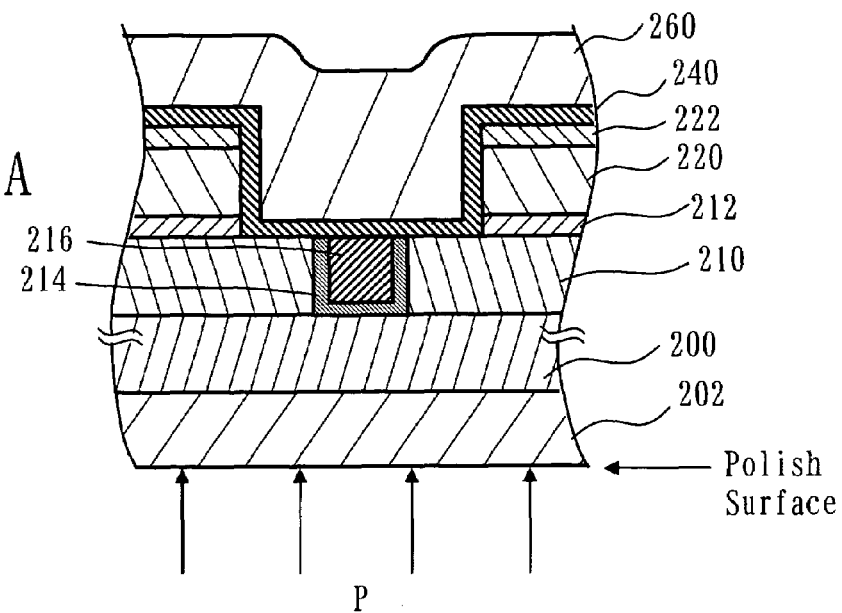
Figure 5B:
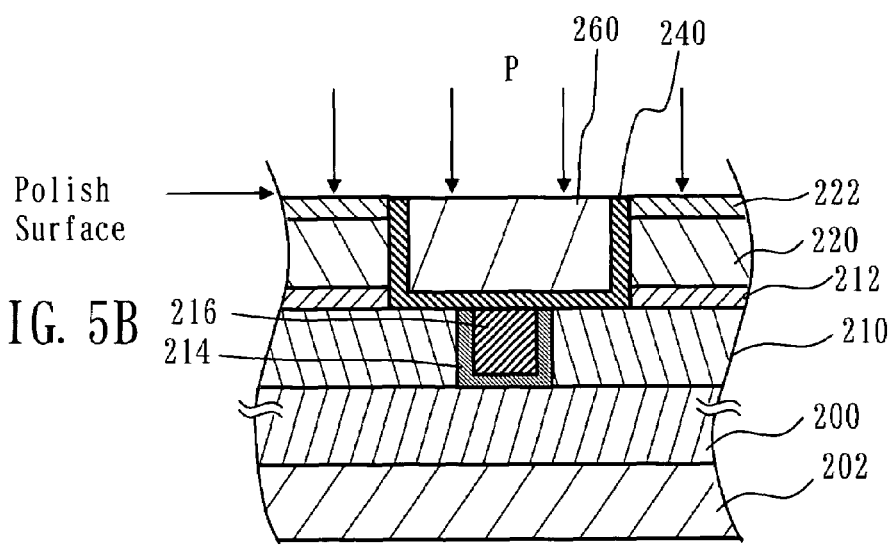

FIGS. 5A and 5B depict, in cross-section, some processes to be done in a way corresponding to the flowchart of FIG. 1—i.e., from the back-surface polishing step S122 to the surface polishing step S124 in FIG. 1.

As shown in FIG. 5A, at the back-face polish step S122, the SiN film 202 on the back surface of substrate 200 is polished by CMP techniques.

Figure 6:
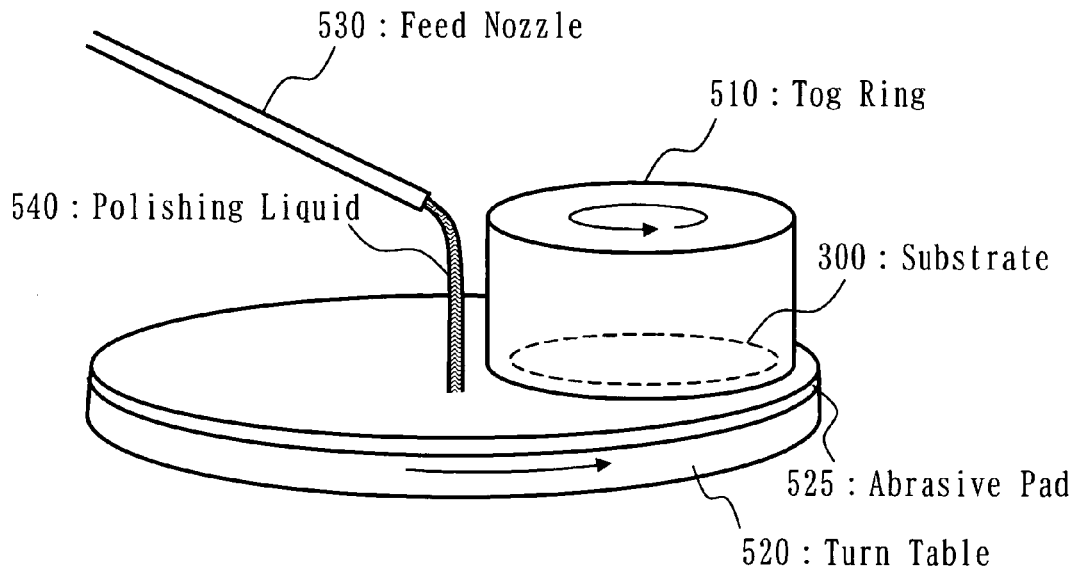
FIG. 6 is a diagram showing schematically a perspective view of a polishing table structure of chemical-mechanical polish (CMP) apparatus.
Figure 7:
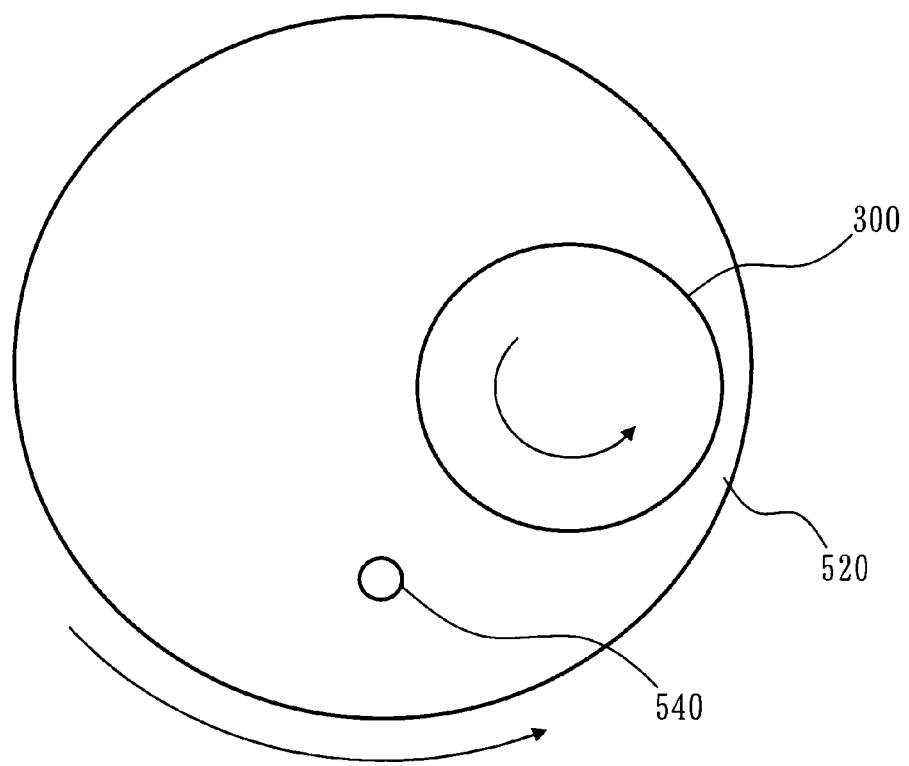
FIG. 7 depicts a plan view of the CMP table structure of FIG. 6 for explanation of an operation thereof.

FIG. 6 shows a perspective view of a rotatable table structure of CMP equipment. A plan view of the structure of CMP equipment of FIG. 6 is shown in FIG. 7 for explanation of an operation thereof. In FIG. 6, the CMP apparatus is of the rotary type, which is an example of polishing equipment. The illustrative CMP tool includes a turn table 520 having on its top surface a sheet of abrasive pad 525 and a top ring 510 disposed thereon. This top ring supports a substrate 300 while letting its to-be-polished surface (polish surface) face downward. After having supplied pure water from a water feed nozzle 530 onto the abrasive pad 525 to flow thereon, a polishing liquid 540 is supplied from the feed nozzle 530. After completion of the wafer surface polishing using the polishing liquid 540, pure water is fed from nozzle 530 to flow residual polish liquid components on abrasive pad 525 for substitution or replacement. As shown in FIG. 7, the top ring 510 is driven to rotate to thereby rotate substrate 300 while at the same time causing turn table 520 also to rotate accordingly. The polishing liquid 540 is fed to fall down onto abrasive pad 525 at a specific position (indicated by "540" in FIG. 7) that is adjacent to front side of the substrate 300 along the rotation direction of turn table 520 whereby the polish liquid 540 supplied coats the substrate surface uniformly.

Figure 8:
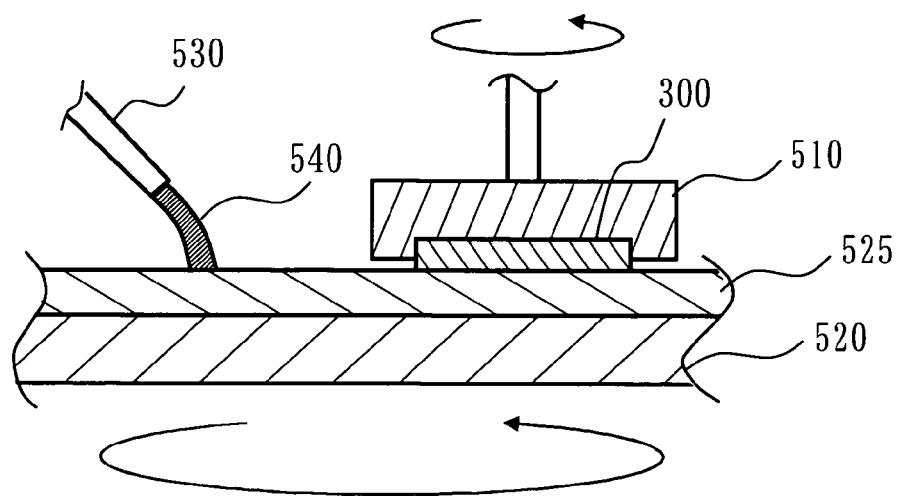
FIG. 8 is a cross-sectional view of main part of the CMP table structure shown in FIG. 6.

FIG. 8 is a cross-sectional view of the turn table structure of CMP apparatus shown in FIG. 6. While driving the turn table 520 with the abrasive pad 525 pasted thereto to rotate at 100 min$^{-1}$ (rpm), let the substrate 300 come into contact with the abrasive pad 525 by means of the substrate-holding top ring 510 with application of a polishing pressure P of about 1.96× 10$^4$ Pa (200 gf/cm$^2$). The number of rotation of the top ring 510 was set to 105 min$^{-1}$ (rpm). The polishing liquid 540 was fed from nozzle 530 at a flow rate of 0.2 liters per minute (200 cc/min). The abrasive pad 525 used here was Rodel® IC1000.

Although the back-face polishing is attainable by mere execution of the polishing with the flow of pure water, it is preferable to use in addition to the pure water a polishing liquid of the type containing fine abrasive grains—in particular, resin particles. Alternatively, a surface active agent or "surfactant" may be used along with the pure water. More preferably a backface polishing liquid is used which contains both the abrasive particles and the surfactant.

Exemplary materials of the resin particles are polymethylmethacrylate (PMMA), polystyrene, polyethylene, polyethylene glycol, polyvinyl acetate, polybutadiene, polyisobutylene, polypropylene, and polyoxymethylene. Other usable examples of the resin particles are phenol resin, urea resin, melamine resin, polyacetal resin and polycarbonate resin.

When using resin particles, SiN is less than or equal to 5 nm/min in mat film polish rate, which is settable to substantially zero. In view of the fact that a multilayered wiring pattern is typically formed through execution of metal-film CMP processing for more than ten times, the polish rate is lowered to make it possible to prevent outdiffusion of metal film by the initially formed SiN film 202 in every polishing event. It is thus possible by using the resin particles to perform polishing in a way such that a diffusion prevention film remains at the termination of the polishing. Owing to the polish rate lowering, fabrication may be controlled by a polish time period rather than by detection of a polish end point. For example, the polish time is set to 60 seconds or more. Another advantage of the approach to using resin particles is that the resin particles act as abrasive micrograms to enable successful removal of irregular convex or hump-like portions as projected from a reference level of the SiN film 202—that is, protuberances with a risk of stress concentration to mold flashes or the like. It is also possible by a functional group(s) of the resin particles to preclude metal contamination and permit the film to have increased hydrophilicity to thereby avoid reattachment of remnant or "slag" polish particles.

Note here that the polishing particles for use as abrasive micrograms are not limited to the resin particles and may alternatively be inorganic particles, such as colloidal silica or equivalents thereto. The colloidal silica is inorganic particulate material; however, unlike alumina or fumed silica, the colloidal silica is relatively high in protrusion removability and yet less in polish rate of the reference level of a to-be-polished surface while offering an ability to suppress occurrence of scratch defects and production of dusts during polishing. Owing to these merits, the colloidal silica is well employable for practical implementation of the invention.

Examples of the surface active agent or surfactant as used herein are as follows: as negative ions or "anions," dodecylbenzene sulfonic kalium, dodecylbenzene sulfonic ammonium, polycarboxylate ammonium (e.g., TK-75 commercially available from KAO Kabushiki Kaisha) and polyacrylic acid salts are usable; as positive ions or "cations," cetyl-trimethyl-ammonium chlorides or polymer-type cation (e.g., KD-84 available from KAO) may be used; as nonions, acetylenediol-based nonion (HLB18), fluorinated nonion, polyvinylpyrrolidone, polyvinyl alcohol or else is usable. Using the surfactant is recommendable as it serves to accelerate dissolution of particles while adsorbing to a backface material (here, SiN film 202) and then acting as a protective film for preventing reattachment of "slag" polish particles.

Figure 9:
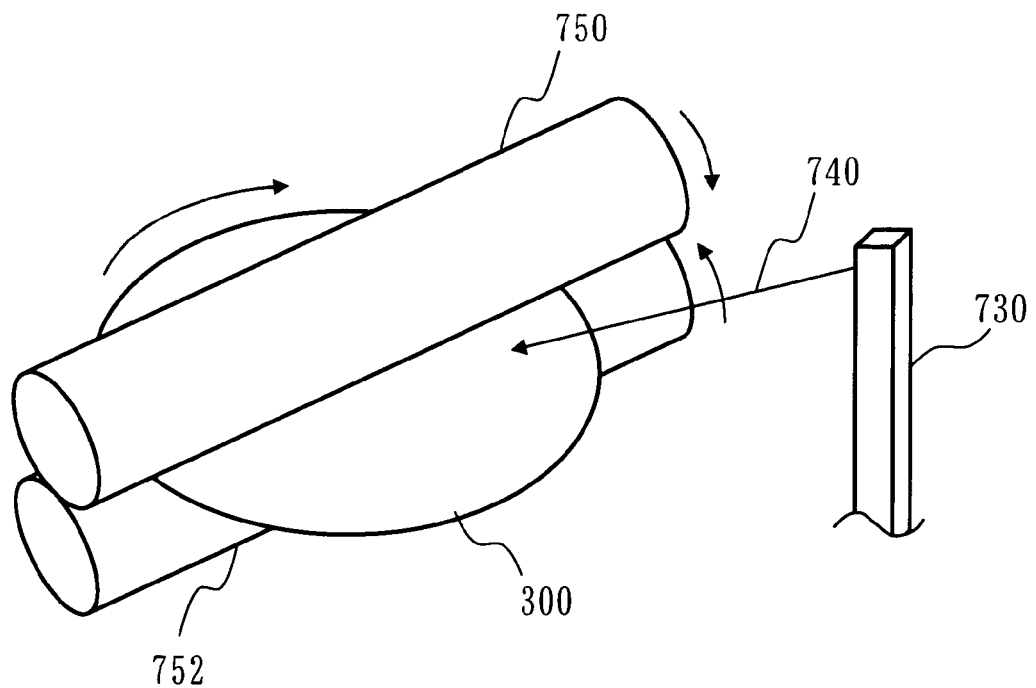
FIG. 9 is a pictorial representation of an exemplary structure of cleaning apparatus.
Figure 10:
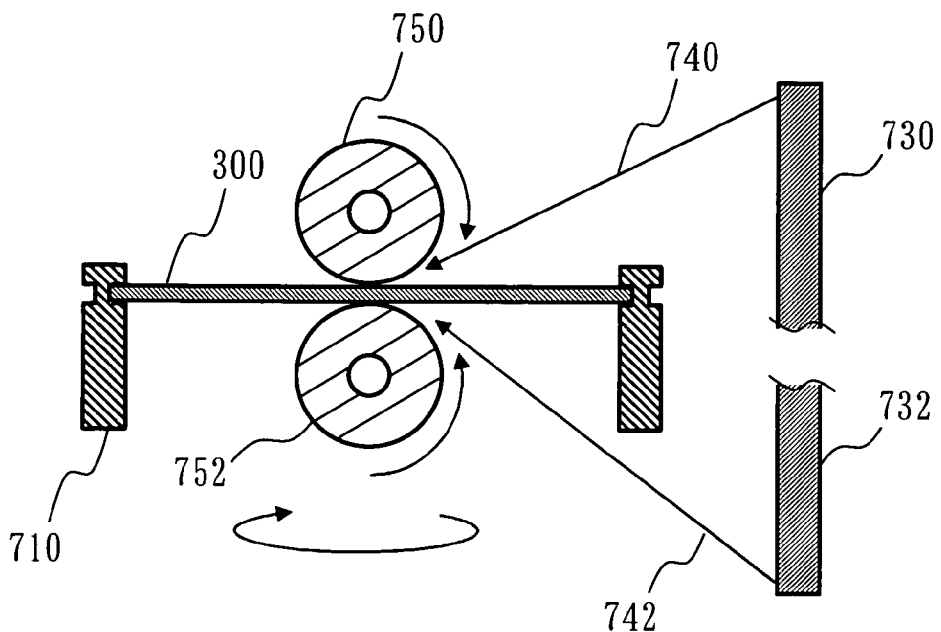
FIG. 10 is a cross-sectional view of the cleaning apparatus shown in FIG. 9.

FIG. 9 shows a perspective view of an example of wafer cleaning machinery. A cross-sectional view of the cleaner is shown in FIG. 10.

After completion of the backface polishing, the resulting substrate is then subject to a cleaning process, which is part of post-CMP cleaning treatment. In this step, a wafer supporting tool 710 shown in FIG. 10 is used to hold thereon the substrate 300 while letting its polished surface be directed upward. Then, drive the substrate 300 to rotate by rotation of a rotary shaft (not shown). Simultaneously, a supply port 730 shown in FIGS. 9 and 10 supplies a cleaning liquid 740 toward an upper substrate surface whereas a feed port 732 shown in FIG. 10 supplies a cleaner liquid 742 toward a lower face. As shown in FIGS. 9-10, the substrate 300 is held tight on its top and back surfaces by a pair of self-rotating brush rollers 750 and 752 and thus is brush-scribed.

Figure 11:
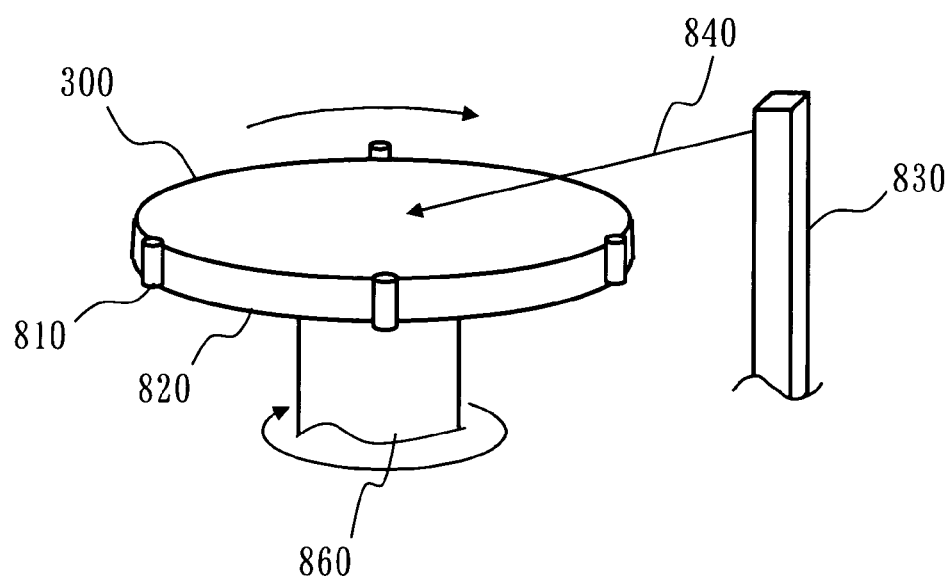
FIG. 11 depicts a perspective view of the structure of another cleaning apparatus.

FIG. 11 is a perspective view of another exemplary cleaner tool. As shown herein, the brush-scribing (also called the roll-brush washing) shown in FIGS. 9-10 is followed by a rinsing process step, which mounts and holds the substrate 300 by a set of four supporting members 810 that are disposed on the round edge of a turn table 820. While rotating the turn table 820 by rotation of a rotary shaft 860 to thereby rotate the substrate 300, a flow of pure water 840 is supplied thereto from a feed port 830 so that rinse washing is performed. Although only the upper surface is subjected to the rinsing, both substrate surfaces may be rinsed.

Turning back to FIG. 5B, at the surface polish process step, the top surface of substrate 200 is polished by CMP for planarization to thereby remove away surface portions of the Cu film 260 and seed film 250 plus barrier metal film 240 that become a wiring layer for use as an electrical conductor, which portions are deposited on those surface portions of the SiOC film 222 other than the opening 150, resulting in formation of a buried Cu wire structure as shown in FIG. 5B.

In the top surface polish process also, the polishing conditions are essentially the same as those in the back-face polish process except that an abrasive liquid used is different. The top face polish-use abrasive liquid is pure water as blended with 1.5 weight percent (wt %) of persulfate ammonium, 0.5 wt % of quinaldic acid, 0.2 wt % of glycine, 0.5 wt % of colloidal silica, 0.04 wt % of dodecylbenzene sulfonic kalium, and 0.05 wt % of polyvinyl-pyrrolidone, which water was then adjusted by potassium hydroxide (KOH) to pH9. The polishing is such that overpolishing of +50% was performed for a CMP time period in which the Cu film 260 (including the seed film 250) and the barrier metal film 240 are removed resulting in exposure of the SiOC cap film 222. Then, brush-scribe cleaning is done in a similar way to the above-stated backface polish process, followed by execution of rinsing. Each apparatus is similar to that of the backface polish process, so an explanation thereof is eliminated herein.

Here, in order to affirm whether film peel-off and scratching take place during the Cu film polishing, a plurality of wafers each having the Cu film 260 deposited thereon at the above-described plating step S120 are used and processed under different sample processing conditions which follow.

1) A wafer sample No. 1 (#1) was prepared with its Cu film 260 above the top surface of substrate 200 being subjected to surface polishing without execution of the back-surface polishing and back-face cleaning of substrate 200.

2) A sample #2 is such that its Cu film 260 above the top surface of substrate 200 was surface-polished after having applied roll-brush cleaning to the back surface of substrate 200 for 60 seconds using a flow of pure water in the cleaner apparatus shown in FIGS. 9-10.

3) A sample #3 is the one that was processed in a way which follows. After having applied roll brush cleaning for 60 sec. in the cleaner shown in FIGS. 9-10 by using as the abrasive liquid for polishing the back face of substrate 200 an abrasive liquid (with no surface active agent) which contains 1 wt % of resin particles (base material is PMMA with surface functional group of COOH, SO$_3$H), roll brush cleaning using pure water is performed for 60 sec., followed by execution of surface polishing of the Cu film 260 overlying the top surface of substrate 200.

4) Sample #4 was obtained in such a way that after having applied roll brush cleaning for 60 sec. in the cleaner of FIGS. 9-10 by using as the abrasive liquid for back-face polishing of substrate 200 an abrasive liquid which contains 1 wt % of resin particles (base material is PMMA with surface functional group of COOH, SO$_3$H) and 0.1 wt % of surface active agent (polyacrylic kalium), roll brush cleaning using pure water was performed for 60 sec., followed by execution of surface polishing of the Cu film 260 overlying the top face of substrate 200.

5) Sample #5 was prepared in a way which follows. After completion of backface polishing using pure water for 60 sec., pure-water roll brush cleaning (60 sec.) and rinsing cleaning were applied, followed by surface polishing of the Cu film 260 above the top surface of substrate 200.

6) Sample #6 is such that after having performed backface polishing for 60 seconds by using as the abrasive liquid for polishing the backface of substrate 200 an abrasive liquid (with no abrasive grains) which contains 0.05 wt % of surfactant (cetyl-trimethyl ammonium chloride), backface polishing using pure water was performed for 30 sec., followed by execution of pure-water roll brush cleaning (60 sec.) and rinsing and then surface-polishing of the Cu film 260 over the top surface of substrate 200.

7) Sample #7 was prepared by a process which includes the steps of performing backface polishing for 60 sec. by use of an abrasive liquid (with no surfactant) which contains 0.5 wt % of colloidal silica as the abrasive liquid for polishing the backface of substrate 200, performing backface polishing using pure water for 30 sec., applying pure-water roll-brush cleaning (60 sec.) and rinsing, and then performing surface polishing of the Cu film 260 above the top surface of substrate 200.

8) Sample #8 was prepared by a process including the steps of performing backface polishing (60 sec.) using as the abrasive liquid for polishing the backface of substrate 200 an abrasive liquid (without surfactant) containing therein 1 wt % of resin particles (base material is PMMA with surface functional group of COOH, SO$_3$H), performing backface polishing (30 sec.) using pure water, applying pure-water roll-brush cleaning (60 sec.) and rinsing, and then performing surface polishing of the Cu film 260 above the top face of substrate 200.

9) Sample #9 was prepared by a process having the steps of performing backface polishing (60 sec.) using as the abrasive liquid for polishing the backface of substrate 200 an abrasive liquid (without surfactant) containing therein 1 wt % of resin particles (base material is polystyrene with surface functional group of NH$_2$), performing backface polishing (30 sec.) using pure water, applying pure-water roll-brush cleaning (60 sec.) and rinsing, and then performing surface polishing of the Cu film 260 above the top surface of substrate 200.

10) Sample #10 was prepared by a process having the steps of performing backface polishing (60 sec.) using as the abrasive liquid for polishing the backface of substrate 200 an abrasive liquid that contains therein 1 wt % of colloidal silica and 0.1 wt % of surfactant (dodecylbenzene sulfonic kalium), performing backface polishing (30 sec.) using pure water, applying pure-water roll-brush cleaning (60 sec.) and rinsing, and performing surface polishing of the Cu film 260 above the top face of substrate 200.

11) Sample #11 was prepared by a process which follows. Perform backface polishing for 60 sec. using as the abrasive liquid for polishing the backface of substrate 200 an abrasive liquid which contains 1 wt % of resin particles (base material is polystyrene with surface functional group of NH$_2$) and 0.1 wt % of surfactant (polyvinylpyrrolidone). Then, perform backface polishing using pure water for 30 sec. Next, apply pure-water roll-brush cleaning (60 sec.) and rinsing. Thereafter, perform surface polishing of the Cu film 260 above the top face of substrate 200.

Figure 12:
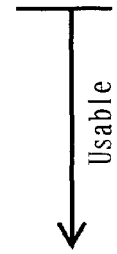
FIG. 12 is a diagram showing, in table form, evaluation results of several test samples concerning whether these have film peel-off and scratching defects after surface polishing treatment.

FIG. 12 shows, in table form, sample test results indicating the presence or absence of occurrence of film-peeling and scratching defects. Evaluation was done by visual inspection to determine whether film peel-off is present or absent and also to count up a number of scratch defects as found on the polished Cu film 260 and SiOC film 222. Regarding the film peeloff, a judgment of "Not Good" (X) was made in cases where even one of twenty five substrates 200 has such film peeloff. As for the scratching, a defect checker (manufactured by KLA-Tencor Corporation) was used to inspect top surfaces of the Cu film 260 and SiOC film 222 and made a decision of "NG" (X) if a substrate 200 under testing has a total of more than ten scratch defects per unit area of 1 cm². If a test substrate has such defects at a number of portions which ranges from five to ten, then it judged to be "Acceptable" (A). If it has a less number of defects ranging from one to five then judgment of "Good" (○) was made. If it has no scratch defects then judgment of "Excellent" (⊚) was reached.

As shown in FIG. 12, Samples #5 to #11 exhibited improvements both in film peel-off and in scratching. Comparing Samples #2-#4 to Sample #5, it can be seen that the polishing is more effective than the roll brush cleaning. Additionally, comparing Sample #5 to Samples #8-#11 reveals the fact that when performing the backface polishing, use of the resin particle-containing abrasive liquid is more effective than others. Comparing Sample #6 to Samples #8-#9 reveals that use of the resin particle-containing abrasive liquid is more effective than the use of surface active agent or surfactant. Comparing Sample #7 to Samples #8-#9 reveals the use of resin particles having a functional group(s) is more effective than using colloidal silica of inorganic particles having no functional groups. Comparing Sample #9 to #11, it can be seen that the use of certain abrasive liquid which contains surfactant in addition to resin particles is more effective.

Semiconductor substrates can come into contact at their back faces with a hanger and stage made of ceramic or Teflon (Registered Trademark) during transportation. This would result in unwanted creation of mold flashes due to scarring and/or attachment of contaminant particles such as metal or silicon rubbishes. It can be seen that chemical liquid treatment and roll brushing for backface cleaning fail to have an ability to remove such mold flashes and particles.

By performing substrate backface polishing prior to substrate top-face polishing treatment in the way stated previously, it is possible to prevent film peel-off and scratch defects otherwise occurring during substrate surface polishing at the time the Cu wiring pattern is formed on or above a low-k dielectric material, which is inherently less in mechanical strength due to its porosity.

Note that the apparatus for performing backface CMP and top-face CMP is obtainable through mere alteration in wafer conveyance/transfer software programs of the currently available apparatus, thereby to enable execution of the intended process on the same polishing table in the same hardware system. Additionally, in light of the fact that a metallic film is formed on the entire top surface of a semiconductor substrate during the backface polishing, the finally formed damascene wires are not in direct contact with the top ring of CMP apparatus, so it is possible to avoid damages against the damascene wires to be finally formed in the backface polishing process. It must be noted that the backface polishing liquid is carefully designed so that it has no influenceability during CMP of the metal film. In case the backface is polished after completion of the top face polishing, what must be done in order to avoid occurrence of damages such as scarring due to the finally formed damascene wire's direct contact with the top ring of CMP apparatus is to deposit a film of resist or polyimide as a surface protective film by way of example and then polish the backface and further remove such protective film, resulting in an increase of two extra process steps, that is, the protective film deposition and removal steps, which leads to an increase in manufacturing costs as well as a decrease in throughputs. In this embodiment these risks are also avoidable.

Next, analysis was done to ascertain an improvement of chuck errors in exposure equipment and also to evaluate a wire having a width of 70 nm and a length of 1 m. In this case also, a plurality of wafers each having the Cu film 260 deposited at the plating step S120 are used for such evaluation under the same conditions as those of Samples 1 to 11 stated supra.

Thereafter, for a respective one of the wafers that were processed as in Samples #1-#11, an SiCN film was deposited on the Cu wiring layer. Each wafer was then transported onto the stage of a stepper tool that is exposure equipment, for patterning of via holes with a diameter of 70 nm. The frequency of chuck errors of the stage at that time was measured for comparison. The stepper used here is NSR-S206D (manufactured by Nikon Corporation). Next, a second layer of Cu wires having the dual damascene structure was formed, followed by evaluation of a yield of wires. Regarding the chuck errors, the judgment of "NG" (x) was made when a chuck error takes place at even one of fifty separate substrates 200 processed. As for the wire yield, a substrate with its open-short yield of more than 98% was judged to be usable (○).

FIG. 13 is a table showing evaluation results of the chuck error frequency and the wire yield. As shown in FIG. 13, Samples #1-#4 are such that six to eight wafers out of fifty wafers experienced chuck errors, so these are judged to be NG. For Samples #5-#11, fifty wafers were all OK.

In terms of the wire yield, Samples #1-#4 were judged to be NG (x) since these are 70 to 85%. On the contrary, Samples #5-#11 with the backface polishing applied thereto were such that the open-short yield is 98% or greater, so these are judged to be OK (○). More specifically, Samples 5-11 exhibiting effects for the film-peeling and scratching are also demonstrated to offer appreciable effects against the chuck errors and the wire yield.

By execution of the substrate backface polishing prior to its top-face polishing in the way stated above, it is possible to suppress chuck errors in exposure apparatus.

Embodiment 2

Although in the embodiment 1 the semiconductor device fabrication method was described with emphasis on the process for forming electrical conductor wires made of Cu as an example, the substrate polishing process is not exclusively limited thereto. In an embodiment 2, a semiconductor device fabrication method will be discussed below while letting the description focus on a process step of forming conductive plugs for electrical interconnection between on-chip circuit elements (device portions) and wires associated therewith.

Figure 14:
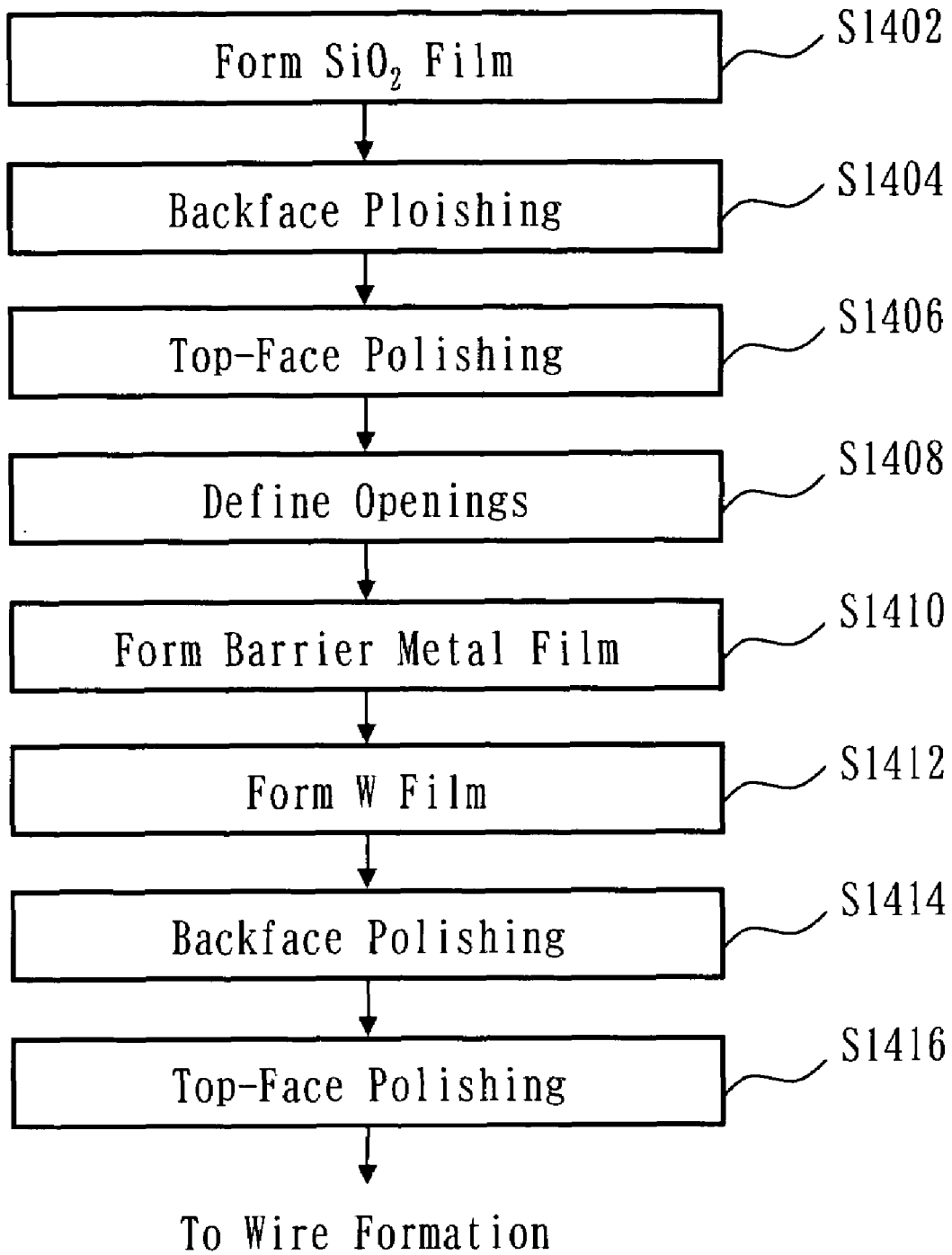
FIG. 14 is a flowchart showing main process steps of a semiconductor device fabrication method in an embodiment 2.

FIG. 14 is a flowchart showing major steps in the manufacture of a semiconductor device in the embodiment 2. As shown herein, this embodiment performs a series of processes including an $SiO_2$ film forming step S1402 of forming a thin-film of $SiO_2$ film, a back-surface polishing step S1404 of polishing the back surface of a substrate, a top surface polishing step S1406 of polishing the thin-film of $SiO_2$ film, an opening forming step S1408 of defining openings, a barrier metal film forming step S1410, a W film forming step S1412 of forming a thin-film of W film, a back-face polishing step S1414 of polishing the back surface of the substrate, and a top surface polishing step S1416 of polishing the barrier metal film and W film.

Figure 15A:
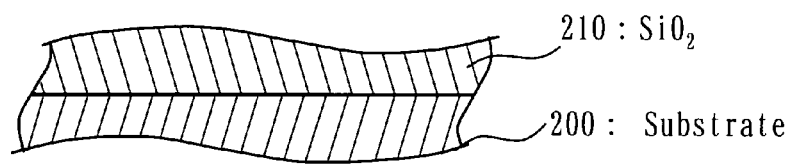
FIGS. 15A-15C, 16A-16C and 17A-17C illustrate, in cross-section, some major process steps to be carried out in a way corresponding to the flowchart of FIG. 14.
Figure 15B:
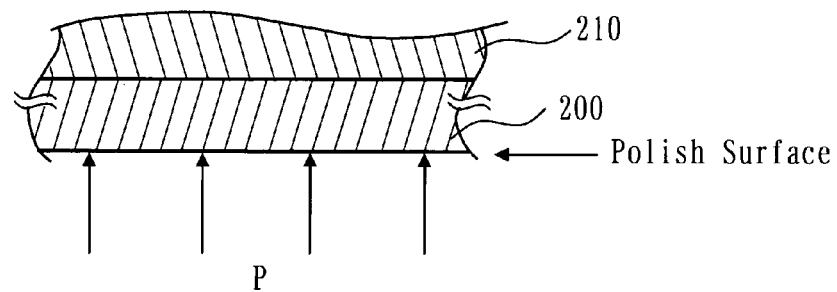
Figure 15C:
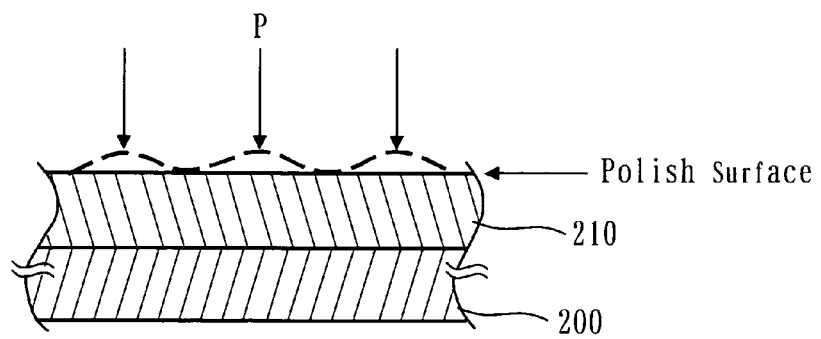

FIGS. 15A to 15C illustrate, in cross-section, some major processes to be executed in a way corresponding to the flowchart of FIG. 14—more specifically, from the $SiO_2$ film forming step S1402 to the surface polishing step S1406 in FIG. 14. The following steps will be described later.

As shown in FIG. 15A, at the $SiO_2$ film forming step, a thin film of $SiO_2$ with a thickness of about 500 nm is deposited by CVD techniques on the top surface of a substrate 200 with device portions formed thereon, thereby forming an $SiO_2$ film 210 for later use as a dielectric film of a plug layer. Although the film is formed here by CVD, other techniques may be used. In the case of depositing the $SiO_2$ thin-film 210, it is preferable that the top surface of the substrate 200 prior to the deposition is flat. However, if the substrate surface is "waved" due to gate formation or the like for example, then the deposited $SiO_2$ film 210 also is waved on its surface. Thus it is desirable in this case also to perform the surface polishing for planarization of the surface of $SiO_2$ film 210. In such case also, film peeling and scratching problems are occurrable. These problems are avoidable by polishing the back surface of substrate 200 in a similar way to the embodiment 1.

Then, as shown in FIG. 15B, at the back-face polishing step S1404, the back surface of the substrate 200 is CMP-polished. Although in the embodiment 1 the SiN film 202 was formed as a diffusion prevention film on the back face of substrate 200 in order to prevent Cu diffusion during formation of Cu wires, when considering a procedure covering up to the plug formation, such SiN film 202 acting as the diffusion prevention film may be eliminated and the backface of the substrate 200, e.g., a silicon wafer, may be polished directly. Obviously, as in the embodiment 1, the SiN diffusion prevention film 202 or else (second thin-film) may be formed on the backface of substrate 200. In case the SiN diffusion prevention film 202 is formed, this film is surface-polished in a similar way to the embodiment 1. Note here that the apparatus structure and polish conditions may be the same as those of embodiment 1, so explanations thereof are omitted. In view of the fact that the ability to remove protuberances as created on a polish surface is high with the polish rate at a reference surface being low and with scratch/polish dusts being less in number, it is preferable that an abrasive liquid to be used in the plug formation also is designed to contain resin particles similar to those of embodiment 1 or inorganic particles such as colloidal silica. Lowering the reference-surface polish rate makes it possible to prevent overpolishing of the substrate 200. Additionally it accelerates dissolution of particles and behaves to adsorb onto the backface of substrate 200 to become a protective film which serves to prevent reattachment of remnant polish particles, so it is preferable in the plug formation also that the abrasive liquid contains surface active agent or "surfactant," which is similar to that in the embodiment 1. After completion of the backface polishing, pure water-based roll brush cleaning and rinsing are carried out in a similar way to the embodiment 1.

In FIG. 15C, at the top-surface polish step S1406, polish the $SiO_2$ thin-film 210 thus formed on the top surface of substrate 200. A polishing tool used here is similar to that of the embodiment 1, so its explanation is omitted. Polishing conditions may be appropriately adjusted to resemble the conditions for polishing an oxide film. By planarizing the $SiO_2$ film 210, it is possible to prevent a barrier metal and/or W to be deposited at later steps as will be described layer from remaining in concave portions at those positions which are different from desired positions whereat the barrier metal or W is required to reside as plugs.

By performing backface polishing prior to the polishing of the $SiO_2$ film 210, it is possible to prevent film peel-off and scratch defects otherwise occurring in the case of polishing of $SiO_2$ film 210. It is also possible to suppress chuck errors in exposure apparatus.

Figure 16A:
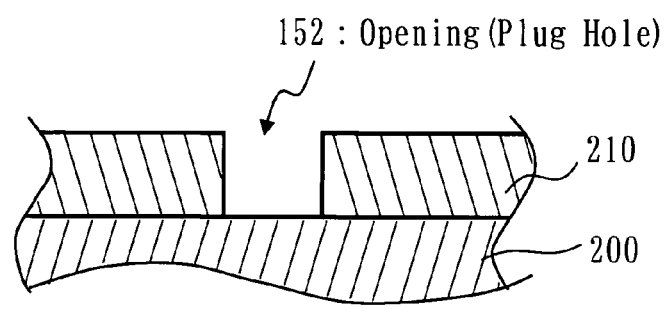
Figure 16B:
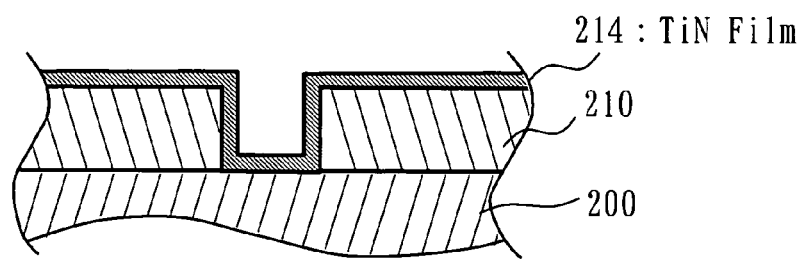
Figure 16C:
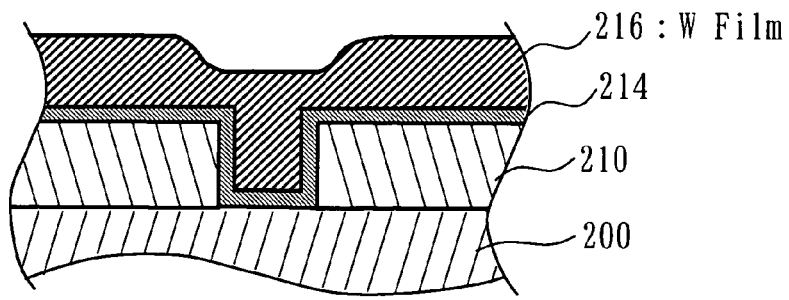

FIGS. 16A to 16C depict in cross-section process steps to be done in a way corresponding to the flowchart of FIG. 14—i.e., from the opening forming step S1408 to the W film forming step S1412 in FIG. 14. Their following steps will be described later.

As shown in FIG. 16A, at the opening forming step S1408, an opening 152 is defined in the $SiO_2$ film 210 so that it has a plug aperture (hole) structure for plug fabrication in lithography and dry etch processes. An exemplary approach to forming the opening 152 is as follows. After having formed a resist film on the $SiO_2$ film 210 above substrate 200 through lithography processes including a resist deposition process and exposure process (not shown), the $SiO_2$ film thus exposed is selectively removed away by anisotropic etch techniques to thereby define the opening 152. The use of such anisotropic etching makes it possible to define the opening 152 almost vertically in the top surface of substrate 200. An example of the anisotropic etching is RIE.

As shown in FIG. 16B, at the barrier metal film forming step S1410, a titanium nitride (TiN) thin-film 214 is formed as a conductive barrier metal film on the surface of $SiO_2$ film 210 so that TiN film 214 covers the opening 152 which was defined at the above-noted opening forming step. The TiN thin-film 214 is formed within a sputtering apparatus using a sputter technique, which is one of physical vapor deposition (PVD) methods. The barrier metal material deposition is not limited to PVD and may alternatively be ALD, ALCVD or CVD stated previously. The coverage ratio is made better than the case of using PVD method.

In FIG. 16C, at the W film forming step S1412, a thin-film 216 of tungsten (W) which is one example of conductive material is deposited and formed by CVD on the surface of substrate 200 so that it covers the TiN film 214—coated inner wall of the opening 152.

Then, polish the surface of substrate 200, resulting in removal of those portions of the W film 216 and TiN film 214 which are deposited on the surface of $SiO_2$ film 210 other than the opening 152. In this case also, the problem as to film peel-off and scratching defects can occur. This problem is avoidable by polishing the back surface of substrate 200 in a similar way to the embodiment 1.

Figure 17A:
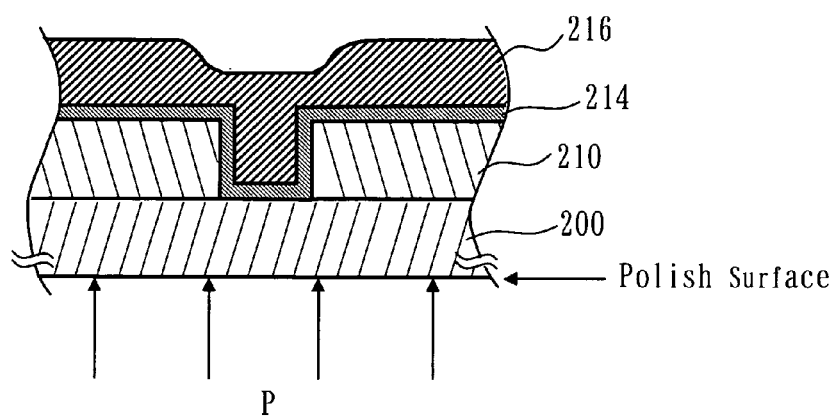
Figure 17B:
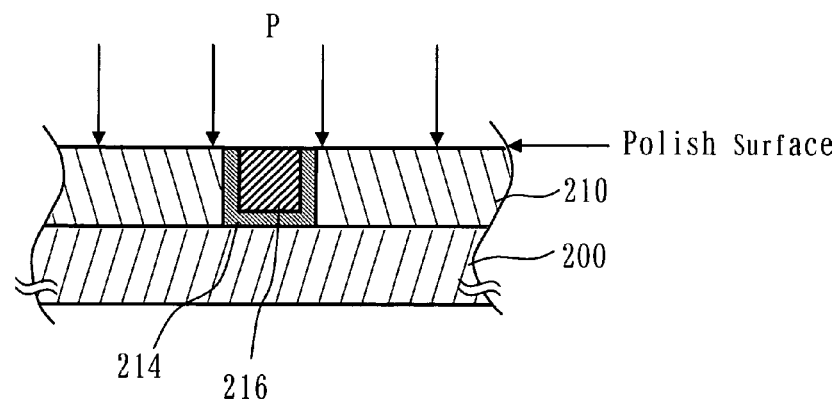
Figure 17C:
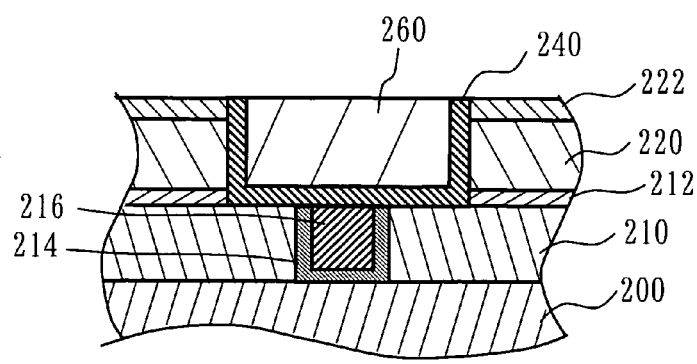

FIGS. 17A to 17C show, in cross-section, process steps to be done in a way corresponding to the flowchart of FIG. 14. FIGS. 17A-17C indicate the back-face polishing step S1414 up to the surface polishing step S1416 of FIG. 14 along with a Cu wiring structure to be formed thereafter.

In FIG. 17A, at the backface polishing step S1414, the back surface of the substrate 200 is CMP-polished. Although in the embodiment 1 the SiN film 202 was formed as a diffusion prevention film on the back face of substrate 200 in order to prevent Cu diffusion during formation of Cu wires, when considering a procedure covering up to the plug formation, such SiN film 202 acting as the diffusion prevention film may be eliminated and the backface of the substrate 200, e.g., a silicon wafer, may be polished directly. Obviously, as in the embodiment 1, the SiN diffusion prevention film 202 or else (second thinfilm) may be formed on the backface of substrate 200. In case the SiN diffusion prevention film 202 is formed, this film is surface-polished in a similar way to the embodiment 1. Note here that the apparatus structure and polish conditions may be the same as those of embodiment 1, so explanations thereof are omitted. In light of the fact that the ability to remove protuberances as created on a polish surface is high with the polish rate at a reference surface being low and with scratch/polish dusts being less in number, it is preferable that an abrasive liquid to be used in the plug formation also is designed to contain resin particles similar to those of embodiment 1 or inorganic particles such as colloidal silica. Lowering the reference-surface polish rate makes it possible to prevent overpolishing of the substrate 200. Additionally in view of the fact that it accelerates dissolution of particles and behaves to adsorb onto the backface of substrate 200 to become a protective film which serves to prevent reattachment of remnant polish particles, it is preferable in the plug formation also that the abrasive liquid contains surfactant, which is similar to that in the embodiment 1. After completion of the backface polishing, pure water-based roll brush cleaning and rinsing are carried out in a similar way to the embodiment 1.

In FIG. 17B, at the top-face polish step S1416, the top surface of the substrate 200 is polished to remove away those portions of the W film 216 and TiN film 214 which are deposited on the surface of $SiO_2$ film 210 other than the opening 152, thereby to form plugs, one of which is shown in FIG. 17B. A polishing tool used here is similar to that of embodiment 1, so an explanation thereof is omitted. Polish conditions may be adequately adjusted so that these are similar to the process conditions for polishing the W film 216 and TiN film 214.

Thereafter, electrical interconnect wires are formed as shown in FIG. 17C.

In the plug formation process also, it is possible to prevent film peel-off and scratch defects by performing the substrate backface polishing prior to its top surface polishing treatment in the way stated above. It is also possible to preclude or minimize chuck errors in the exposure apparatus.

Embodiment 3

In the embodiment 1, the semiconductor device fabrication method was described with emphasis on the process for forming electrical conductor wires made of copper (Cu) as an example. In the embodiment 2 the semiconductor device fabrication method was discussed while focusing on the process of forming conductive plugs for interconnection between device portions and wires. However, the substrate polishing process is not limited to these examples only. In an embodiment 3, a semiconductor device fabrication method will be explained while letting the description focus on a process for performing element isolation which is required prior to fabrication of device portions, e.g., a step of forming a shallow trench isolation (STI) structure.

Figure 18:
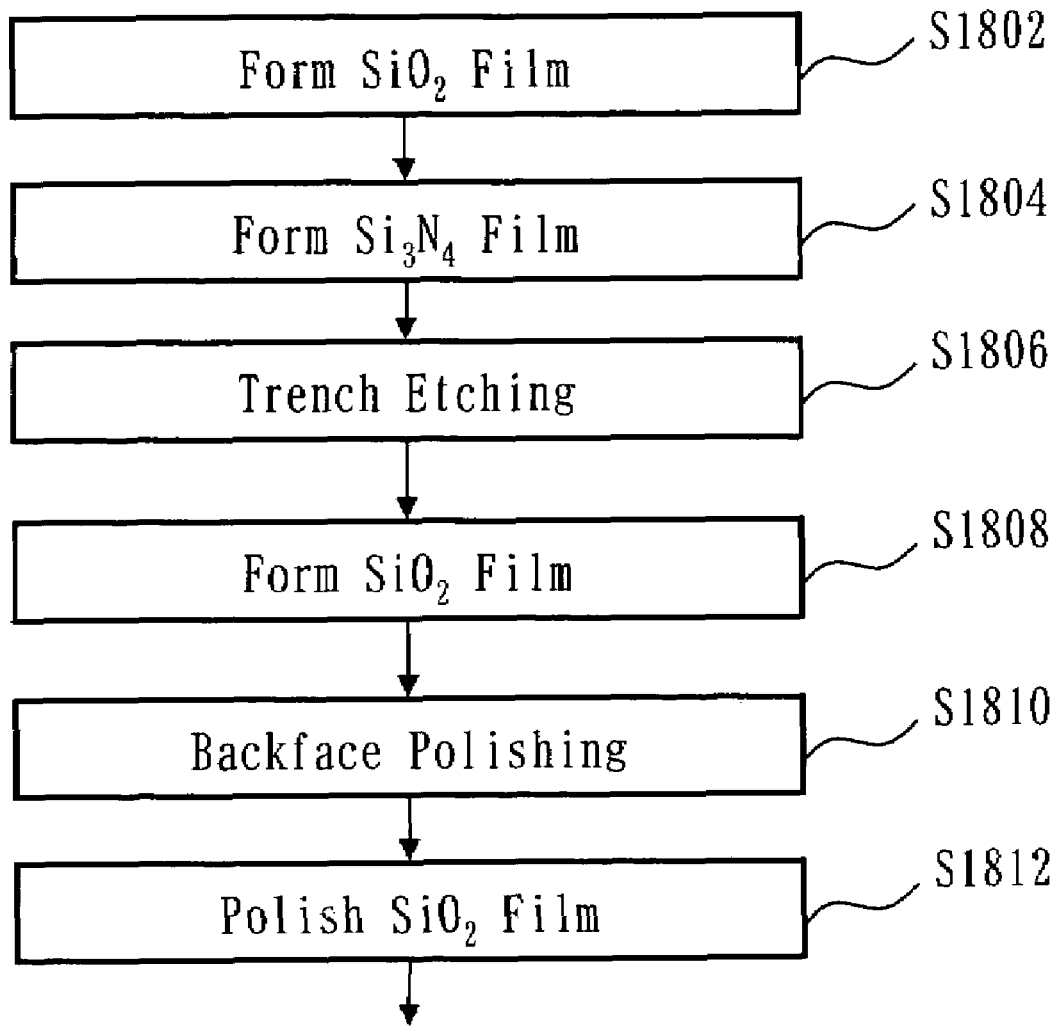
FIG. 18 is a flowchart showing main process steps of a semiconductor device fabrication method in an embodiment 3.

FIG. 18 is a flowchart showing main steps of a semiconductor device fabrication method in the embodiment 3. As shown herein, this embodiment method is arranged to perform a series of processes including an $SiO_2$ film forming step S1802 which forms a thin-film of $SiO_2$, an $Si_3N_4$ film forming step S1804 which forms a thinfilm of silicon nitride ($Si_3N_4$) film, a trench etching step S1806 which defines trench-like grooves, a $SiO_2$ film forming step S1808 which forms a thin-film of $SiO_2$, a back-face polishing step S1810 which polishes the back surface of a substrate, and a top-face polishing step S1812 which polishes the $SiO_2$ film.

FIGS. 19A to 19D illustrate, in cross-section, some process steps to be executed in a way corresponding to the flowchart of FIG. 18—i.e., from the $SiO_2$ film forming step S1802 to the $SiO_2$ film forming step S1808 in FIG. 18. The following steps will be described later.

Figure 19A:
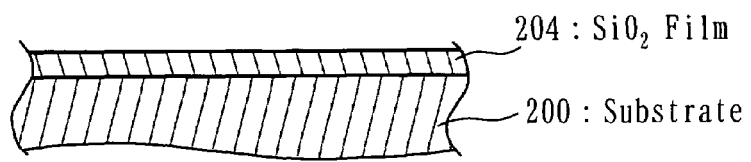
FIGS. 19A-19D and 20A-20B depicts in cross-section those steps to be done in a way pursuant to the flowchart of FIG. 18.

As shown in FIG. 19A, at the $SiO_2$ film forming step S1802, a thin-film of $SiO_2$ is formed by thermal oxidation on a top surface of substrate 200, thereby forming an $SiO_2$ film 204 for later use as a mask for trench formation. Although the film formation is done by thermal oxidation here, other methods are employable.

Figure 19B:
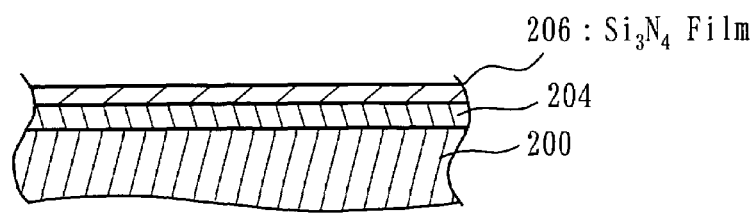

In FIG. 19B, at the $Si_3N_4$ film forming step S1804, deposit a thin-film of $Si_3N_4$ by CVD techniques on the surface of $SiO_2$ film 204, thereby to form an $Si_3N_4$ film 206 for later use as the mask for trench formation in a similar way to the $SiO_2$ film 204. Although the film is formed by CVD here, other methods are usable.

Figure 19C:
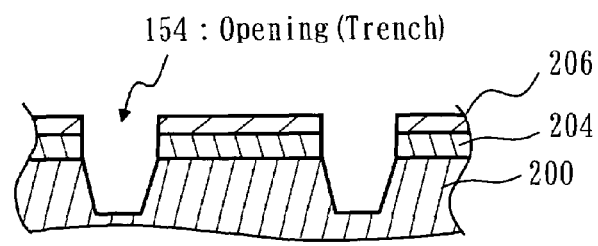

In FIG. 19C, at the trench etch step S1806, use lithography and dry etch techniques to define trench-like openings 154 in the top surface of substrate 200 with the $SiO_2$ film 204 and $Si_3N_4$ film 206 being as a mask therefor.

Figure 19D:
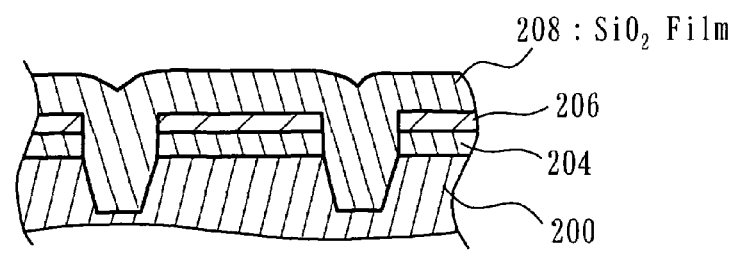

In FIG. 19D, at the $SiO_2$ film forming step S1808, deposit a thin-film of $SiO_2$ by CVD on the $Si_3N_4$ film 206 so that it covers or "buries" the openings 154 as defined at the trench etching step S1806. Then, form an $SiO_2$ film 208 for later use as a dielectric element isolation film. Next, polish the top surface of substrate 200 to thereby remove selected portions of the $SiO_2$ film 208 and $Si_3N_4$ film 206 plus $SiO_2$ film 204 which are deposited on the surface of substrate 200 other than the trenches 154. In such case also, film peel-off and scratch defects can occur. This problem is avoidable by polishing the back surface of the substrate 200 in a similar way to the embodiments 1-2 stated supra.

Figure 20A:
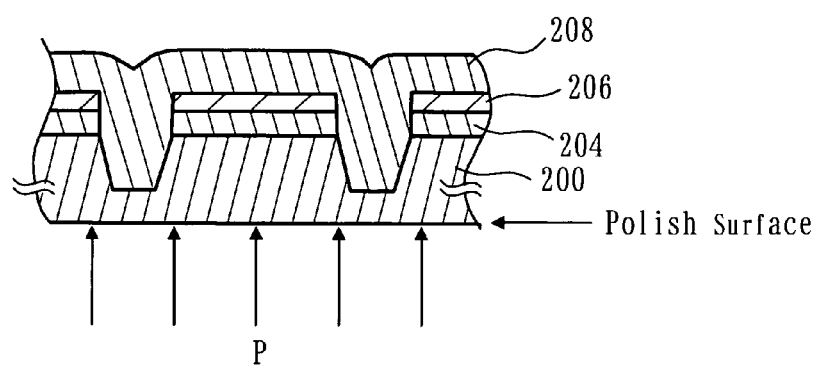
Figure 20B:
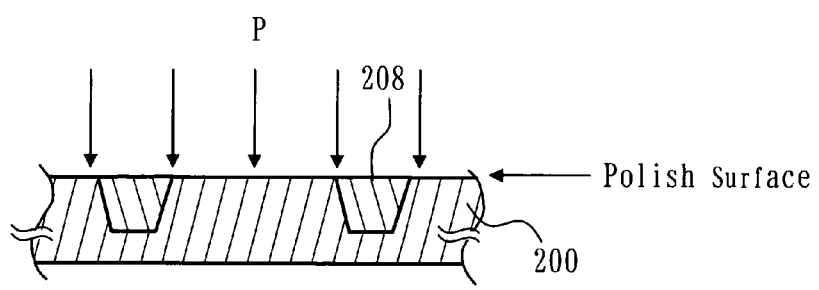

FIGS. 20A and 20B depict, in cross-section, some process steps in the flowchart of FIG. 18, i.e., the back-face polishing step S1810 to the top-face polishing step S1812.

As shown in FIG. 20A, at the backface polishing step, polish the back surface of the substrate 200 by CMP techniques. While in the embodiment 1 the SiN film 202 was formed as a diffusion prevention film on the back face of substrate 200 in order to prevent Cu diffusion during formation of Cu wires, when considering a procedure covering up to the STI structure formation, such SiN film 202 acting as the diffusion prevention film may be eliminated and the backface of the substrate 200, e.g., a silicon wafer, may be polished directly. Obviously, as in the embodiment 1, the SiN diffusion prevention film 202 or else (second thin-film) may be formed on the backface of substrate 200. In case the SiN diffusion prevention film 202 is formed, this film is surface-polished in a similar way to the embodiment 1. Note here that the apparatus structure and polish conditions may be the same as those of embodiment 1, so explanations thereof are omitted. In light of the fact that the ability to remove protuberances as created on a polish surface is high with the polish rate at a reference surface being low and with scratch/polish dusts being less in number, it is preferable that an abrasive liquid to be used in the STI structure formation also is designed to contain resin particles similar to those of embodiment 1 or inorganic particles such as colloidal silica. Lowering the reference-surface polish rate makes it possible to prevent overpolishing of the substrate 200. Additionally in view of the fact that it accelerates dissolution of particles and behaves to adsorb onto the backface of substrate 200 to become a protective film which serves to prevent reattachment of remnant polish particles, it is preferable in the STI structure formation also that the abrasive liquid contains therein surfactant, which is similar to that in the embodiment 1. After completion of the backface polishing, pure water-based roll brush cleaning and rinsing are carried out in a similar way to the embodiment 1.

Then, as shown in FIG. 20B, at the top-face polishing step, polish the top surface of substrate 200 to remove selected portions of the $SiO_2$ film 208 and $Si_3N_4$ film 206 plus $SiO_2$ film 204 which are deposited on the surface of substrate 200 other than the trench openings 154, thereby forming an STI structure shown in FIG. 20B. A polishing tool used here is similar to that of embodiment 1, so its explanation is omitted. Polishing conditions are adequately adjustable so that these are similar to the conditions for polishing the $SiO_2$ film 208, $Si_3N_4$ film 206 and $SiO_2$ film 204.

Thereafter, device portions are formed in a known way, followed by formation of plugs and lead wires.

In the element isolation pattern forming process also, it is possible to prevent film peel-off and scratch defects by performing the substrate backface polishing prior to its top-face polishing in the way stated above. It is also possible to prevent or greatly suppress chuck errors in the exposure apparatus.

While the description above is specifically drawn to the example that is designed to polish the backface of substrate 200 and then perform roll-brush cleaning and rising and thereafter polish the substrate's top surface, this invention should not exclusively be limited thereto. In the substrate backface polish process, execution of the backface polishing using pure water after the abrasive liquid-based backface polishing results in most particulate contaminants being removed away, so it is also preferable to perform the substrate top-face polishing by letting the substrate 200 be turned over in the state that substrate 200 is wet with such pure water. As substrate 200 is wet, no contaminant particles are firmly fixed to the substrate surface: even if contaminants are attached thereto, these are readily removable from the surface of substrate 200 by first-time flow of pure water during substrate surface polishing. Another advantage lies in an ability to reduce in number the required process steps because the workpiece being processed need not be taken out of the CMP apparatus at such step.

In accordance with respective embodiments stated above, it is possible to remove particles being attached to the back surface of the substrate prior to thin-film polishing. This makes it possible to prevent film peel-off and scratching defects otherwise occurring at more than one film on or above the substrate due to residual particles. Furthermore, as it is possible to remove particles attached to the substrate backface, it becomes possible to suppress occurrence of chuck errors of the substrate on the stage in exposure apparatus.

While several embodiments have been described while referring to practically reduced examples, the present invention should not be limited to these examples and may also be applicable to other cases, such as during CMP of Cu when forming multilayered interconnect wires by further forming a dual damascene structured Cu wire pattern(s) after the series of the process steps shown in the flowchart of FIG. 1. In this case also, it is possible to perform the substrate back-face polishing prior to the polishing of the substrate's top surface. Although it is preferable that the backface polishing be done immediately before execution of the top-face polishing as in each embodiment stated supra, similar results are obtainable as far as the backface polishing precedes the top-face polishing.

Furthermore, regarding the interlayer dielectric film thickness and the opening size/shape and number also, it is possible to use appropriately selected ones as required for semiconductor integrated circuits and various types of semiconductor devices.

Any other semiconductor device fabrication methods which incorporates the concept of this invention and which are design-alterable by those skilled in the art should be interpreted to fall within the coverage of the invention.

While explanations on standard technical schemes as ordinarily employed in the semiconductor industry, such as for example photolithography processes and pre/post-cleaning processes, are omitted for purposes of convenience in discussion herein, it would readily occur to skilled persons that such schemes may be involved in the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined in the appended claims and equivalents thereof.

What is claimed is:

1. A method for fabricating a semiconductor device, comprising:
    forming a thin film made of copper (Cu) on a top surface of a substrate;
    polishing a back surface of said substrate, surface portions of said thin film being used as a protective film during polishing the back surface of said substrate, wherein the surface portions of said thin film are a top most film during polishing the back surface of said substrate
    wherein said substrate has on the back surface thereof a diffusion prevention film made of one of silicon nitride (SiN), silicon carbide (SiC), and silicon oxide carbide (SiOC) for preventing diffusion of said Cu, and wherein said diffusion prevention film is polished during the polishing of the back surface of said substrate; and
    polishing said surface portions of said thin film after polishing said diffusion prevention film on the back surface of said substrate.

2. The method according to claim 1, wherein the polishing of the back surface of said substrate is performed by using a polishing liquid with resin particles contained therein.

3. The method according to claim 2, wherein the resin particles used have a functional group on surfaces thereof.

4. The method according to claim 1, wherein the polishing of the back surface of said substrate is performed by using a polishing liquid containing therein a surface active agent.

5. The method according to claim 1, wherein the polishing of the back surface of said substrate is performed by using a polishing liquid containing therein resin particles and a surface active agent.

6. The method according to claim 1, wherein said Cu is used as electrical interconnect wires.

7. The method according to claim 1, wherein a porous material film using a porous material is formed on the top surface of said substrate, and wherein during the forming of said thin film, said thin film is formed above said porous material film.

8. The method according to claim 1, wherein the polishing of the back surface of said substrate is performed by using a polishing liquid with colloidal silica contained therein.

9. The method according to claim 1, further comprising:
    cleaning the back surface of said substrate after having polished the back surface of said substrate and yet prior to the polishing of said thin film.

10. The method according to claim 1, further comprising forming said diffusion prevention film on an upper surface and the back surface of said substrate before forming said thin film.

11. A method for fabricating a semiconductor device comprising:
    forming a diffusion prevention film made of one of silicon nitride (SiN), silicon carbide (SiC), and silicon oxide carbide (SiOC) for preventing diffusion of copper (Cu) on a back surface of a substrate;
    forming on a top surface of said substrate a conductive material film using said Cu with its diffusion being prevented by said diffusion prevention film;
    after formation of said conductive material film, polishing the diffusion prevention film formed on the back surface of said substrate by using a polishing liquid containing therein any one of resin particles and colloidal silica, surface portions of said conductive material film being used as a protective film during polishing the diffusion prevention film, wherein the surface portions of said conductive material film are a top most film during polishing the diffusion prevention; and polishing said surface portions of said conductive material film after polishing said diffusion prevention film.

12. The method according to claim 11, wherein in the polishing of said diffusion prevention film, said diffusion prevention film is polished so that a portion thereof remains at termination of the polishing.

13. The method according to claim 11, wherein said polishing liquid further contains a surface active agent.

14. The method according to claim 11, further comprising forming a diffusion prevention film on an upper surface of said substrate.

* * * * *